(12) United States Patent
Young et al.

(10) Patent No.: US 7,729,393 B2
(45) Date of Patent: Jun. 1, 2010

(54) SURFACE EMITTING LASER WITH AN INTEGRATED ABSORBER

(75) Inventors: Ian A. Young, Portland, OR (US); Ursula Keller, Uitikon-Waldegg (CH); Heiko Unold, Daenikon-ZH (CH); Rüdiger Paschotta, Zürich (CH); Silke Schön, Zürich (CH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/725,659

(22) Filed: Mar. 19, 2007

(65) Prior Publication Data
US 2007/0189350 A1  Aug. 16, 2007

(51) Int. Cl.
H01S 3/113 (2006.01)

(52) U.S. Cl. .............. 372/11; 372/7; 372/10; 372/18; 372/43.01; 372/45.013; 372/50.124; 372/70; 372/71; 372/72; 372/81

(58) Field of Classification Search ........ 372/7, 372/10, 11, 18, 21, 43.01, 45.013, 50.124, 372/70–72, 81
See application file for complete search history.

(56) References Cited

U.S. PATENT DOCUMENTS

| | | | |
|---|---|---|---|
| 4,860,296 A * | 8/1989 | Chemla et al. ........... 372/44.01 |
| 5,062,115 A | 10/1991 | Thornton | |
| 5,115,441 A * | 5/1992 | Kopf et al. ............... 372/45.01 |
| 5,216,263 A | 6/1993 | Paoli | |
| 5,287,376 A | 2/1994 | Paoli | |
| 5,317,170 A | 5/1994 | Paoli | |
| 5,574,738 A | 11/1996 | Morgan et al. | |
| 5,627,853 A | 5/1997 | Mooradian et al. | |
| 5,724,375 A | 3/1998 | Peters | |
| 5,982,802 A | 11/1999 | Thony et al. | |
| 5,991,318 A | 11/1999 | Caprara et al. | |
| 6,167,068 A | 12/2000 | Caprara et al. | |
| 6,418,152 B1 * | 7/2002 | Davis .......................... 372/18 |
| 6,628,695 B1 | 9/2003 | Aldaz et al. | |
| 6,687,282 B2 | 2/2004 | Kim et al. | |
| 6,735,234 B1 * | 5/2004 | Paschotta et al. ............... 372/75 |
| 6,741,619 B1 * | 5/2004 | Thoen et al. .................. 372/18 |
| 2002/0039376 A1 | 4/2002 | Kim et al. | |
| 2002/0067882 A1 | 6/2002 | Guilfoyle | |

(Continued)

FOREIGN PATENT DOCUMENTS

EP         0398038        11/1990

(Continued)

OTHER PUBLICATIONS

Merriam-Webster On-Line definition of "similar."*

(Continued)

Primary Examiner—Wael Fahmy
Assistant Examiner—Hrayr A Sayadian
(74) Attorney, Agent, or Firm—Blakely, Sokoloff, Taylor & Zafman LLP

(57) ABSTRACT

A surface emitting laser (SEL) with an integrated absorber. A lower mirror and an output coupler define a laser cavity of the SEL. A monolithic gain structure positioned in the laser cavity includes a gain region and an absorber, wherein a saturation fluence of the absorber is less than a saturation fluence of the gain region.

10 Claims, 17 Drawing Sheets

U.S. PATENT DOCUMENTS

| | | | |
|---|---|---|---|
| 2002/0110159 A1 | | 8/2002 | Gerstenberger et al. |
| 2002/0122241 A1* | | 9/2002 | LoCascio et al. ............ 359/332 |
| 2003/0113078 A1 | | 6/2003 | Tatum |
| 2003/0169797 A1* | | 9/2003 | Aldaz et al. .................... 372/96 |
| 2004/0101007 A1 | | 5/2004 | Bozso et al. |
| 2005/0213617 A1* | | 9/2005 | Gendron ....................... 372/10 |
| 2005/0238070 A1* | | 10/2005 | Imeshev et al. ............... 372/21 |
| 2006/0009342 A1* | | 1/2006 | Sirota et al. ................... 501/10 |
| 2007/0274361 A1* | | 11/2007 | Calvez et al. ............. 372/50.1 |

FOREIGN PATENT DOCUMENTS

| JP | 2003218449 | 7/2003 |
|---|---|---|
| WO | WO 01/59895 A1 | 8/2001 |

OTHER PUBLICATIONS

"Laser," by Siegman (1987), pp. 663-674.*

Merriam-Webster OnLine definition of "integrate."*

Wundke, K, et al., "PbS quantum-dot-doped glasses for ultrashort-pulse generation", *Applied Physics Letters*, vol. 76, No. 1, (Jan. 2000), 10-12.

Arahira, Shin, et al., "Mode-Locking at very high repetition rates more than Terahertz . . . ", *IEEE Journal of Quantum Electronics*, vol. 32, No. 7, (Jul. 1, 1996), 1211-1224.

Gomes, L A., et al., "Picosecond Sesam-based ytterbium mode-locked fiber lasers", *IEEE Journal of Selected Topics in Quantum Electronics*, vol. 10, No. 1, XP001214337, (Jan. 2004), 129-136.

Huang, Xiaodong, et al., "Passive mode-locking in 1.3 um two-section InAs quantum dot lasers", *Applied Physics Letters*, vol. 78, No. 19, (May 7, 2001), 2825-2827.

Krainer, et al., "77 Ghz soliton modelocked Nd:YVO4 laser", *Electronics Letters*, vol. 36, No. 22, (Oct. 2000), 1846-1848.

Kunimatsu, D., et al., "Passively Mode-Locked Laser Diodes with Bandgap-Wavelength Detuned Saturable Absorbers", *IEEE Photonics Technology Letters*, vol. 11, No. 11, (Nov. 1999), 1363-1365.

Liverini, "Low-loss GaInNAs saturable absorber for passive mode-locking a 1.3 um solid state laser", *Applied Physics Letters*, vol. 84, No. 20, (May 2004), 4002-4004.

Lorenser, D., et al., "Towards wafer-scale integration of high reetition rate passively mode locked surface-emitting . . . ", *Applied Physics B (Lasers and Optics)*, vol. B79, No. 8, (Dec. 2004), 927-932.

Rafailov, et al., "Fast quantum-dot saturable absorber for passive mode locking of solid-state lasers", *LEOS 2003, Annual Meeting of the IEEE Lasers & Electro-optics Society*. Tuscon AZ, vol. 1 of 2, (Oct. 26, 2003).

Spüehler, et al., "Output-coupling semiconductor saturable absorber mirror", *Applied Physics Letters*, vol. 78, No. 18, (Apr. 30, 2001), 2733-2735.

Zhang, et al., "A Picosecond Passively mode-locked vertical extended cavity surface emitting laser", *SCS2003 Intn'l Symposium on Compound Semiconductors, IEEE*, (Aug. 2003), 237-238.

Patent Office of PRC, "Office Action", *Chinese Application No. 200580010780.7*, (Nov. 9, 2007), 1-7.

PCT, "International Preliminary Report on Patentability", *PCT/US2005/010400*, (Oct. 12, 2006), 1-14.

PCT, "International Search Report and Written Opinion", *PCT/US2005/010400*, (Jul. 6, 2005), 1-21.

EPO, "Office Action", *European Application No. 05731285.2-2222*, (Jan. 23, 2008), 1-5.

1.5 Micron Monolithic GaInNAs Semiconductor Saturable-Absorber . . . , by O.G. Okhotnikov et al., Optics Letter, vol. 28, No. 5, pp. 364-366, 2003.

Passively Mode-Locked Laser Diodes . . . , by D. Kuminatsu et al., IEEE Photonics Technology Letters, vol. 11, No. 11, pp. 1363-1365, 1999.

Hoogland et al.: Passively Mode-Locked Diode-Pumped Surface-Emitting Semiconductor Laser; IEEE Photonics Technology Letters, vol. 12, No. 9, Sep. 2000, pp. 1135-1137.

Kardosh, et al.: Vertical-Extended-Cavity Surfac-Emitting Lasers, Annual REport 2002, Optoelectronics Dep't, University of Ulm, pp. 1-7.

Brownell et al.: External Caity Design Yields Ultrafast VCSEL; spie's oemagazing, May 2002, pp. 10-11.

Haering et al.: High-Power Passively Mode-Locked Semiconductor Lasers; IEEE Journal of Quantum Electronics; vol. 38, No. 9, Sep. 2002, pp. 1268-1275.

Jasim et al.: Passively Modelocked Vertical Extended Cavity Surface Emitting Diode Laser; Electronics Letters, vol. 39, No. 4, Feb. 20, 2003, pp. 373-375.

McInerney et al.: High-Power Surface Emitting Semiconductor Laser with Extended Vertical Compound Cavity; Electronics Letters, vol. 39, No. 6, Mar. 20, 2003, pp. 523-525.

Lutgen et al.: 8-W High-Efficiency Continuous-Wave Semiconductor Disk Laser at 1000 NM; Applied Physics Letters, vol. 82, No. 21, May 26, 2003, pp. 3620-3622.

* cited by examiner

SURFACE EMITTING LASER WITH AN INTEGRATED ABSORBER

CROSS REFERENCE TO RELATED APPLICATIONS

This application claims priority to U.S. application Ser. No. 10/814,050 filed on Mar. 31, 2004.

BACKGROUND

1. Field of Invention

The field of invention relates generally to lasers and, more specifically but not exclusively, relates to a surface emitting laser with an integrated absorber.

2. Background Information

Semiconductor lasers have a variety of applications including communication systems and consumer electronics. Generally, semiconductor lasers may be categorized as edge-emitting lasers or surface emitting lasers (SELs). Edge-emitting lasers emit radiation parallel to the semiconductor wafer surface while SELs emit radiation perpendicular to the semiconductor wafer surface. Excitation of the gain region of semiconductor lasers may be through optical pumping or electrical pumping.

Two common types of SELs are vertical cavity surface emitting laser (VCSEL) and vertical external cavity surface emitting laser (VECSEL). Referring to FIG. 1A, a VCSEL 100 is shown. A gain region 106 is sandwiched between mirror 104 and mirror 108. Such mirrors include distributed Bragg reflector (DBR) mirrors. Mirrors 104 and 108 define a laser cavity 112. Laser output 110 is emitted from the mirror 108 perpendicular to the gain region 106.

FIG. 1B shows a VECSEL 150. Mirror 158 is mounted externally and positioned above gain region 156. Mirror 154 and 158 define a laser cavity 162. Mirror 154 includes a DBR mirror. Laser output 160 is emitted from mirror 158.

Mode-locked lasers are used to generate narrow optical pulses on a time scale of picoseconds or less. In general, mode locking involves aligning the phases of longitudinal modes of the laser resulting in a periodic train of short pulses in the laser output. FIG. 1C shows a graph 165 of optical power versus time of a mode-locked laser. The repetition rate of the laser output is based on the period between pulses in graph 165. Mode locking may be achieved through active mode-locking or passive mode-locking. Active mode-locking uses frequency modulation or amplitude modulation through externally controlled modulators. Passive mode-locking is achieved through an absorber, which may include a saturable absorber material. The saturable absorber material may be fabricated from semiconductor material. The saturable absorber material may be fixed to a mirror, which may include a DBR mirror, to form a semiconductor saturable absorber mirror (SESAM).

In a passively mode-locked laser, the desired laser output of short pulses is provided via the absorber. The effect of a saturable absorber in a laser cavity is to favor parts of the circulating radiation with higher intensity over those with lower intensity. After many round-trips, this often leads to the formation of a single short pulse circulating in the cavity. This mechanism is called mode locking because in the frequency domain it corresponds to the creation of a fixed phase relationship between the longitudinal modes of the cavity. The circulating pulse in the laser cavity generates one output pulse each time it hits the output coupler. Thus, a regular pulse train is produced.

FIG. 1D shows a VECSEL 170 with a non-integrated absorber. VECSEL 170 includes a gain region 174 layered on a mirror 172. An output coupler 176 is positioned above the gain region 174. Mirror 172 and output coupler 176 define a laser cavity 178. An optical pump 182 provides the pump energy for VECSEL 170. A semiconductor saturable absorber mirror (SESAM) 184 provides passive mode-locking of VECSEL 170 and is separate from the gain region 174.

Today's passively mode-locked lasers use gain region and absorber materials that generally exhibit very similar saturation properties, so that rather different mode areas on the gain medium and the saturable absorber are required for mode locking. This is currently not achievable in monolithic structures.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a surface emitting laser with an integrated absorber are described herein. In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present invention provide a SEL with an absorber integrated with the gain region. Embodiments of the SEL provide ultra-short pulses (tens of picoseconds or less) with high repetition rates (tens to hundreds of Gigahertz), high optical average output power (tens to hundreds of milliwatts when electrically pumped or optically pumped), and good beam quality ($M^2$ below 2). In contrast to edge-emitting semiconductor lasers, embodiments described herein allow a freely scalable mode spot size for high power output in combination with the high beam quality needed for mode-locking.

Figure 1A:
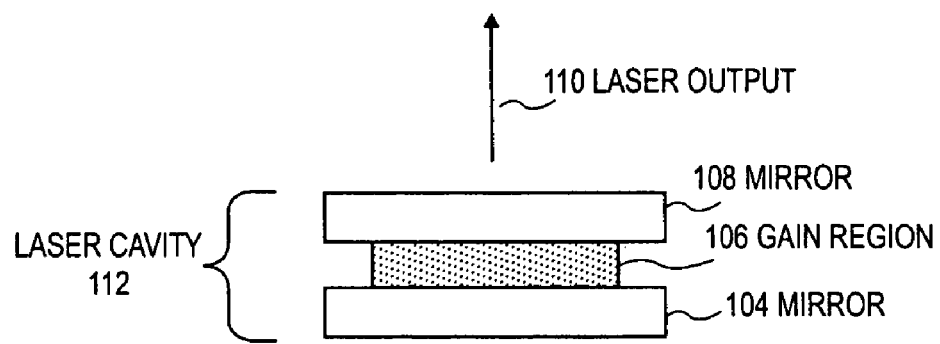
FIG. 1A is a block diagram illustrating a prior art VCSEL.
Figure 1B:
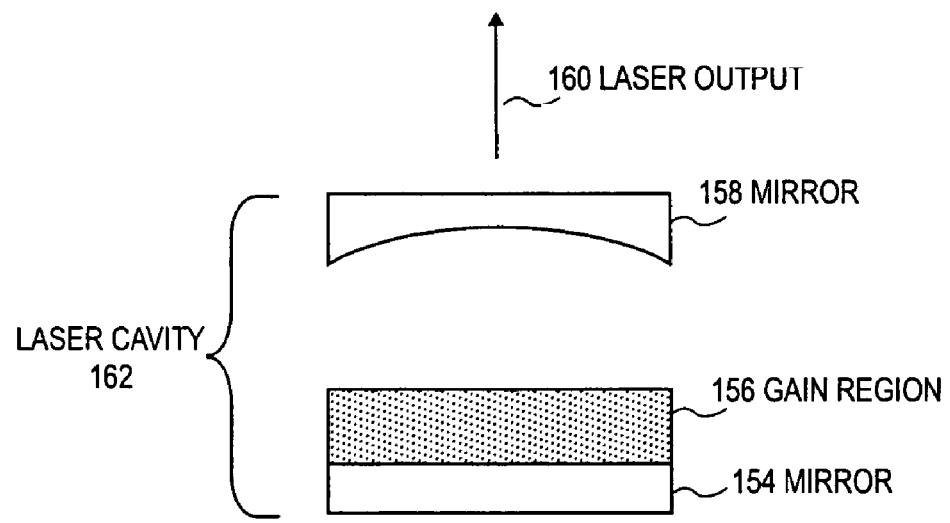
FIG. 1B is a block diagram illustrating a prior art VECSEL.
Figure 1C:
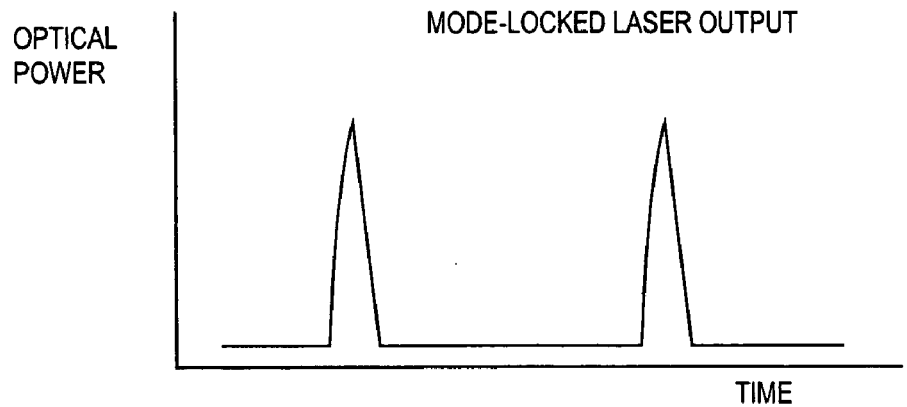
FIG. 1C is a graph illustrating the output pulses of a prior art mode-locked laser.
Figure 1D:
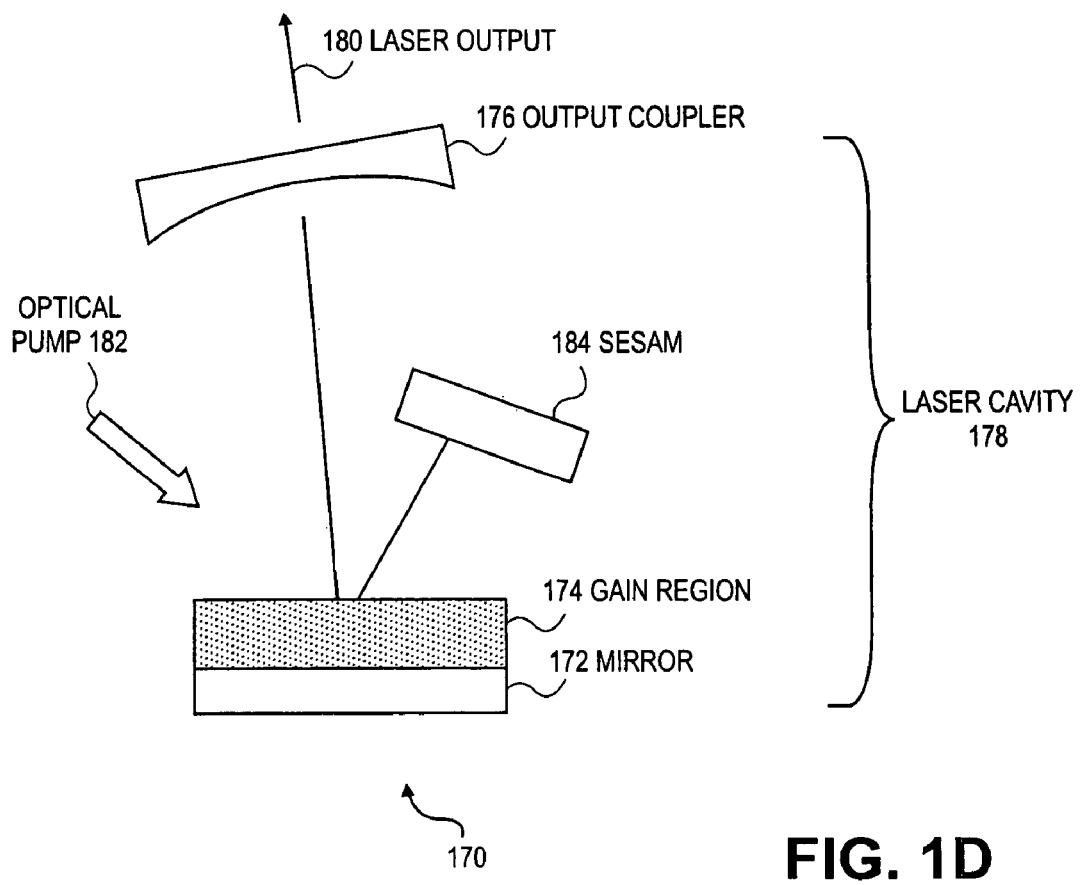
FIG. 1D is a block diagram illustrating a prior art VECSEL with a non-integrated absorber.
Figure 2A:
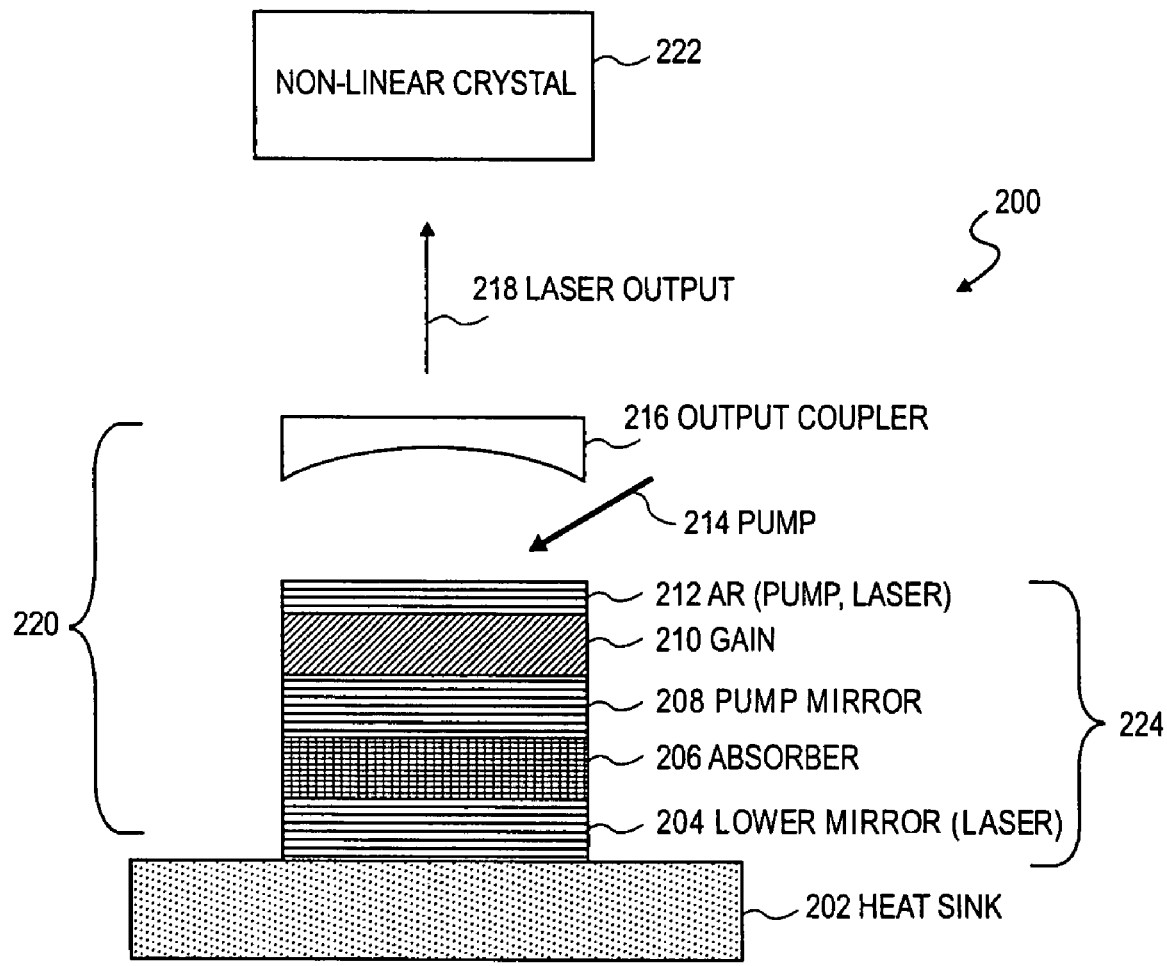
FIG. 2A is a block diagram illustrating one embodiment of a SEL with an integrated absorber in accordance with the teachings of the present invention.

FIG. 2A illustrates one embodiment of a SEL 200. The embodiment of FIG. 2A shows an optically pumped gain structure with an integrated absorber where the absorber is placed below the gain region and pump mirror. An absorber 206 is positioned on lower mirror 204. Lower mirror 204 may include a semiconductor Bragg stack. Lower mirror 204 is highly reflective (HR) as to the laser. A pump mirror 208 is positioned on absorber 206. Pump mirror 208 is highly reflective as to the pump and is partially reflective as to the laser. Gain region 210 is positioned on pump mirror 208. An anti-reflective (AR) layer 212 is positioned on the gain region 210. AR layer 212 is anti-reflective for the laser and the pump energy. Lower mirror 204, absorber 206, pump mirror 208, gain region 210, and AR layer 212 form a monolithic gain structure 224. In one embodiment, monolithic gain structure 224 is fabricated from a substrate in a single fabrication process (discussed further below).

An output coupler 216 is positioned above the AR layer 212. Output coupler 216 and the lower mirror 204 define a laser cavity 220. In one embodiment, output coupler 216 includes a curved output mirror. In operation, an optical pump 214 is applied to SEL 200. A passively mode-locked laser output 218 is emitted from the output coupler 216.

Absorber 206 is integrated with the gain region 210. Absorber 206 includes a semiconductor material that is compatible with the fabrication process of lower mirror 204, pump mirror 208, and gain region 210. The absorber is integrated with the gain region in the same semiconductor wafer. To position the absorber and the gain region in the same monolithic structure, the absorber and the gain region should be operated with similar mode spot size. To allow mode-locking with similar mode sizes in the gain region 210 and the absorber 206, the saturation fluence of the absorber 206 must be lower than the saturation fluence of the gain region 210. In other words, the gain region can handle much greater power densities than the absorber before reaching saturation. It will be understood that integration will generally result in very similar mode sizes inside the gain region and the absorber, because the gain region and the absorber are within the Rayleigh range of the Gaussian laser mode. The laser mode is defined by the lower high reflector (lower mirror 204 in FIG. 2) and the output coupler (216 in FIG. 2).

Fluence describes the light energy per area in a laser cavity. As the wave passes through a medium, such as an absorber or a gain region, some of the power of the wave is lost due to absorption in the medium. In an absorption versus fluence curve (for example, FIG. 2D), the absorption initially depends linearly on the incident fluence. When the medium reaches saturation fluence, the curve breaks from a linear form and begins to flatten out.

In general, semiconductor lasers possess a small gain saturation fluence. This is important for passive mode-locking at high repetition rates especially in combination with high average laser output powers. If the saturation energy of the gain material is too high, Q-switching instabilities may occur, which are difficult to suppress if a high repetition rate is required, and particularly if high laser output power is desired at the same time. With their small gain saturation energy, semiconductor lasers are not limited by such Q-switching instabilities.

Repetition rates in excess of a few Gigahertz (GHz) require very short laser cavities. When using separate devices for the gain structure and the absorber, geometrical constraints may limit the achievable repetition rate. This limitation becomes even more severe when significantly different mode areas are required on the gain structure and the absorber.

Embodiments described herein utilize a gain structure with an integrated absorber. This configuration allows for easy construction of very short linear laser cavities. No folding mirror is needed. Using an integrated absorber effectively removes the geometrical restraint on the pulse repetition rate.

Further, an integrated absorber with reduced saturation fluence allows for higher mode-locked output power at high repetition rates. If the mode size on the absorber has to be very small to achieve sufficient saturation, the danger of thermally damaging the absorber rises quickly with increasing power and repetition rate. When the absorber is made from a different material which exhibits a smaller saturation fluence, the mode size can be kept large and thermal damage is avoided, allowing for higher output power and repetition rate.

Moreover, integration of the absorber into the gain structure may result in low phase noise. This may to lead to very small timing jitter due to a compact and stable setup.

For high repetition rates, the recovery time of the absorber medium is reduced by appropriate means known in the art. Such methods include low-temperature growth or ion bombarding. This introduces non-radiative recombination centers which allow fast trapping and recombination of the carriers generated by absorption.

Various embodiments to reduce the saturation fluence of the integrated absorber are presented herein. In one embodiment, the saturation fluence of absorber 206 may be reduced by adjusting the standing wave field intensities of the gain region 210 and the absorber 206 independently.

Figure 2B:
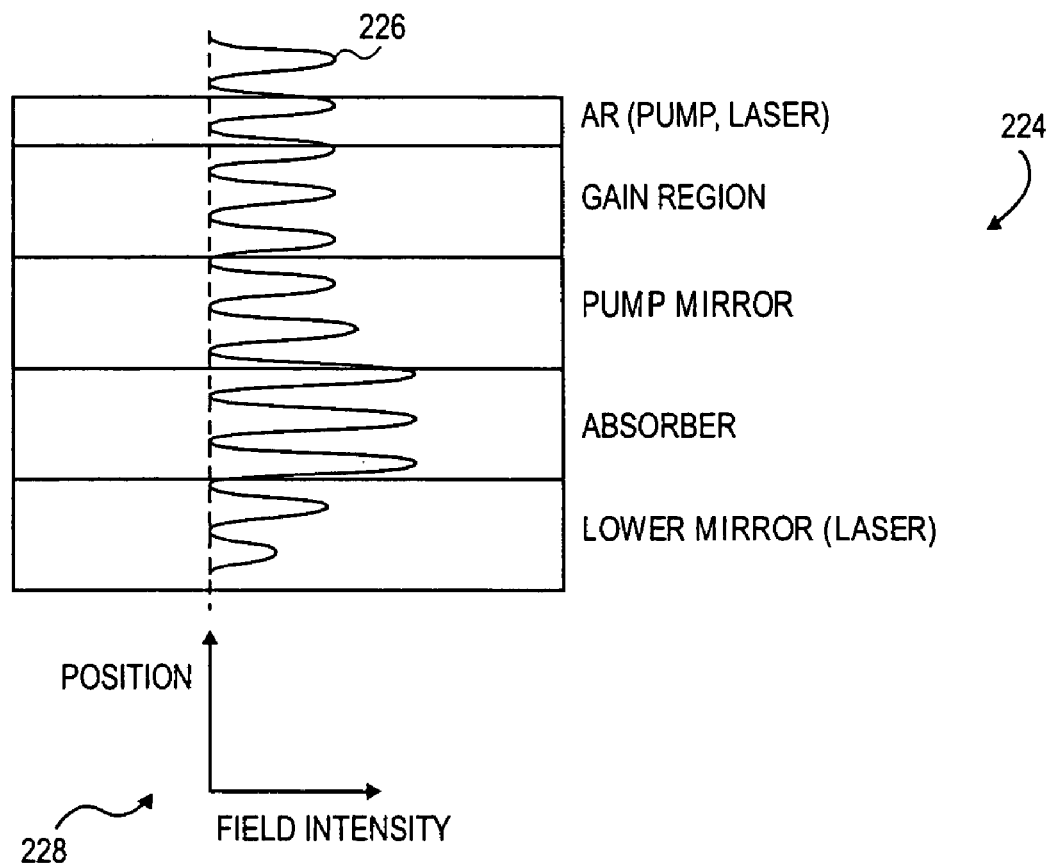
FIG. 2B is a block diagram illustrating one embodiment of a SEL with an integrated absorber in accordance with the teachings of the present invention.

In one embodiment to adjust the standing wave field intensities, the absorber and gain region layers are placed appropriately in the standing wave pattern. Referring to FIG. 2B, a standing wave pattern of the laser wavelength 226 is shown in monolithic gain structure 224 of FIG. 2A. A graph 228 references the position versus field intensity of wave 226. The physical location of absorber 206 has been positioned in the monolithic gain structure 224 so as to be aligned with peak field intensity positions of wave 226. In an alternative embodiment, the lower mirror 204 or the output coupler 216, or both, may be positioned to change the form of wave 226 so that the peak field intensity is aligned with the absorber 206.

In another embodiment to adjust the standing wave field intensities, an intermediate mirror structure is used. The intermediate mirror layer may contain a Bragg mirror with reflectivities for laser and pump wavelengths. The reflectivity for pump wavelength is chosen such that the amount of pump light in the absorber section is appropriate. In the embodiment of FIG. 2A, pump mirror 208 is such an intermediate mirror. The reflectivity for laser wavelength is chosen such that a coupled cavity may be obtained to adjust the field intensity in the absorber section independently of that in the gain region. The field intensity ratio between absorber and gain region is chosen such that the saturation fluence ratio is appropriate.

Figure 2C:
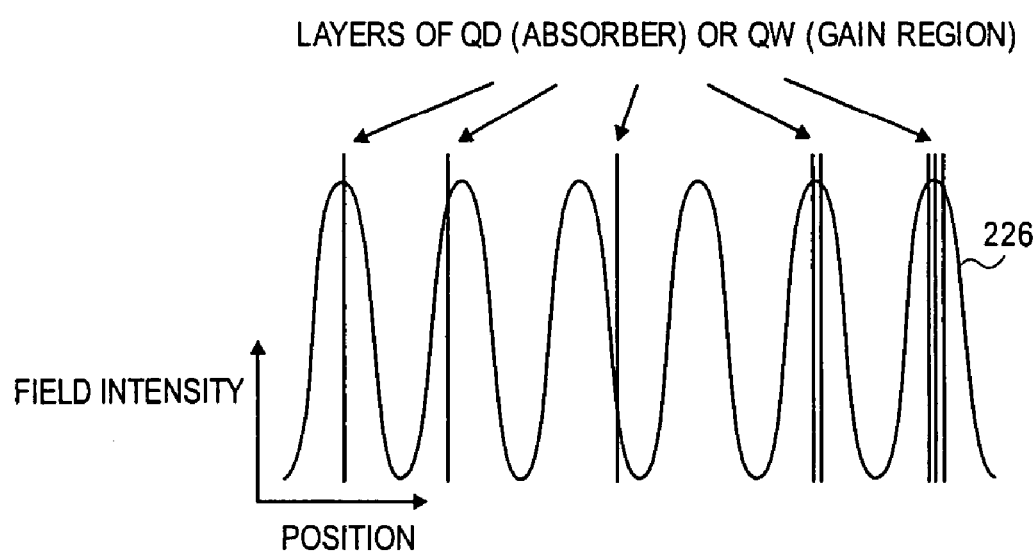
FIG. 2C is a graph of absorber and gain layers relative to field intensity of one embodiment of a SEL with an integrated absorber in accordance with the teachings of the present invention.

In another embodiment, the saturation fluence of absorber 206 may be reduced by using quantum dots (QD) in the absorber 206, while quantum wells (QW) are used in the gain region 210. The absorber 206 may include one or more layers of quantum dots. The gain region 210 may include one or more layers of quantum wells. In embodiments having multiple layers, transparent spacer layers may separate the layers of quantum dots or quantum wells. The individual quantum dot or quantum well layers may be spaced individually or in groups in different positions of the standing wave pattern. In the embodiment of FIG. 2C, sections of the absorber or gain region are shown. The arrows point to layers of quantum dots (in the case of the absorber) or layers of quantum wells (in the case of the gain region). The number and individual positions of quantum dot and quantum well layers may be used to adjust saturation fluence, modulation depth, and wavelength dependence of gain and absorption.

Figure 2D:
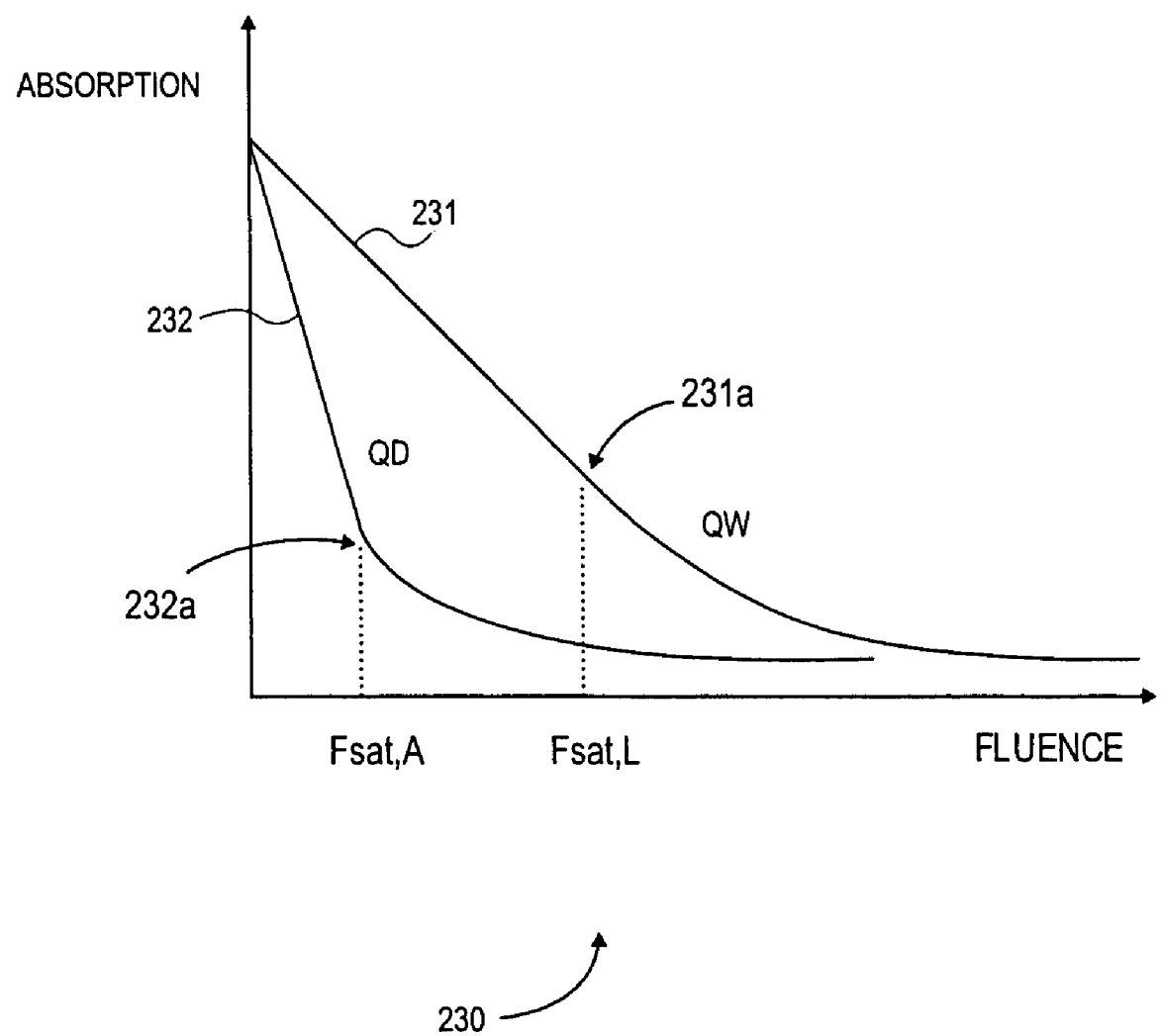
FIG. 2D is a graph of fluence of one embodiment of a SEL with an integrated absorber in accordance with the teachings of the present invention.

Referring to FIG. 2D, a graph 230 of absorption versus fluence is shown. Curve 231 shows the fluence of the gain region having quantum wells (QW), while curve 232 shows the fluence of the absorber having quantum dots (QD). As shown in graph 230, the saturation fluence of the absorber (shown at 232a) is significantly lower than the saturation fluence of the gain region (shown at 231a).

Figure 2E:
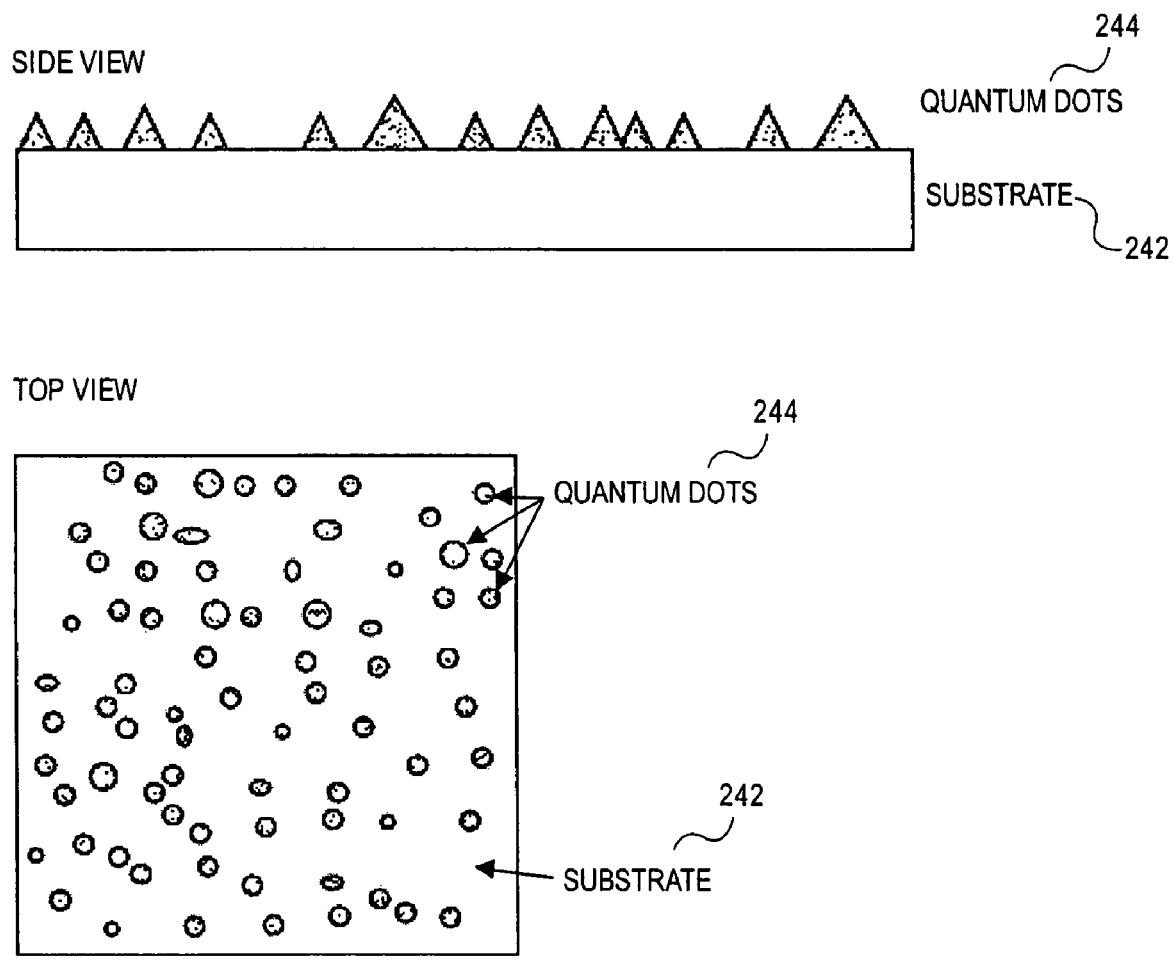
FIG. 2E is a block diagram illustrating one embodiment of a layer of quantum dots of an integrated absorber in accordance with the teachings of the present invention.

FIG. 2E shows an embodiment of a layer of quantum dots in an absorber. Quantum dots 244 are positioned on substrate 242. The quantum dots may be grown by Molecular-Beam Epitaxy (MBE) or Metal-Organic Vapor Phase Epitaxy (MOVPE) in a self-assembled manner. The material used to fabricate the quantum dots includes indium arsenide (InAs), indium gallium arsenide (InGaAs), aluminum gallium arsenide (AlGaAs), or the like. The material surrounding the quantum dots may be gallium arsenide (GaAs), AlGaAs, or the like, in order to influence transition energies in the quantum dots. In one embodiment, the quantum dots have an approximately 10-50 nanometer (nm) base diameter and an approximately 2-10 nm height. The density of the quantum dots may be used to influence the amount of absorption, i.e. the modulation depth of the saturable absorber section. The distribution of the quantum dot sizes may be used to achieve a desired spectral width of the absorption in the saturable absorber section.

In an embodiment of an absorber having multiple layers of quantum dots, a transparent spacer layer is positioned on top of the quantum dots 244. On top of the transparent spacer layer are positioned further quantum dot and spacer layers.

In yet another embodiment, the saturation fluence of absorber 206 may be reduced by using quantum wells in the absorber 206 such that the absorber's saturation fluence is below the saturation fluence of quantum wells in the gain region 210. In one embodiment, the absorber 206 includes one or more quantum well layers of gallium indium nitride arsenide (GaInNAs) while the gain region 210 includes one or more quantum well layers of indium gallium arsenide (InGaAs). In embodiments having multiple layers of quantum wells, transparent spacer layers may separate the layers of quantum wells.

Figure 2F:
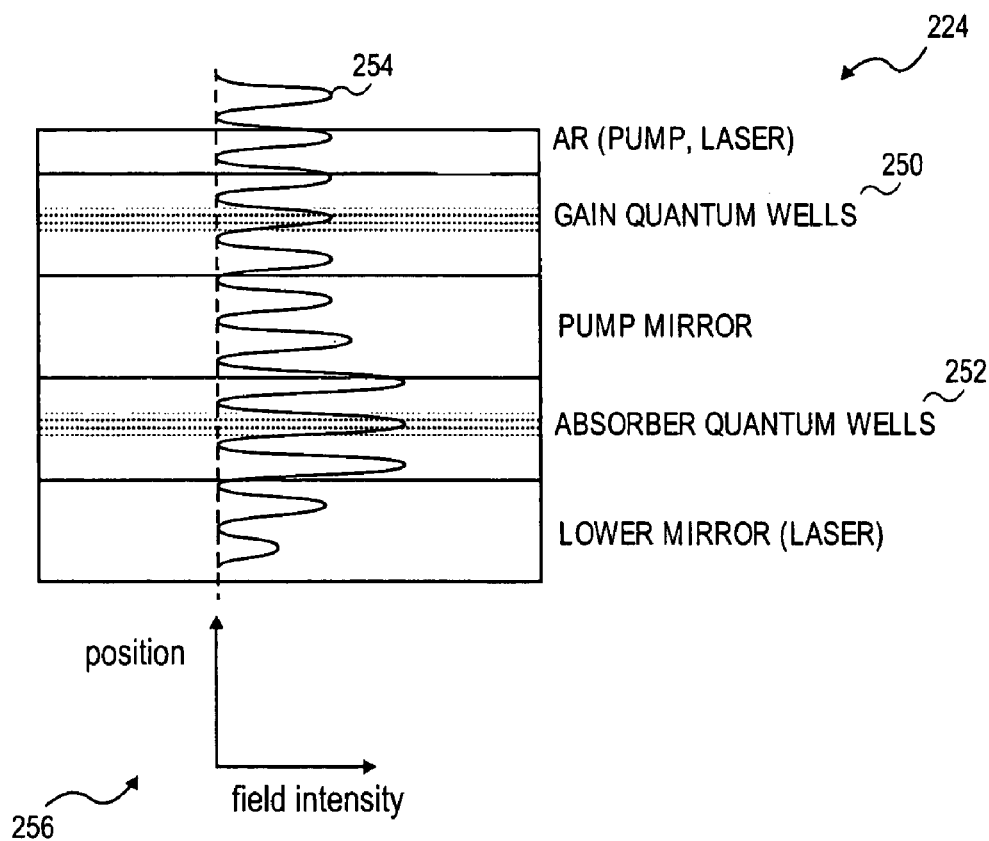
FIG. 2F is a block diagram illustrating one embodiment of a SEL with an integrated absorber in accordance with the teachings of the present invention.
Figure 2G:
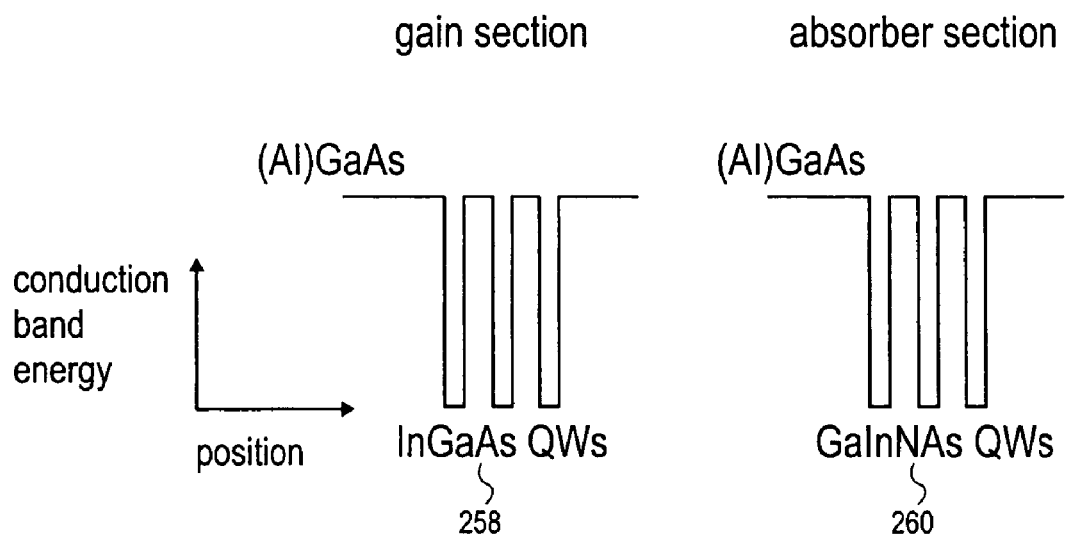
FIG. 2G is a block diagram illustrating one embodiment of quantum wells in accordance with the teachings of the present invention.

Referring to FIGS. 2F and 2G, an embodiment of a SEL having a gain region with quantum wells and an absorber section with quantum wells is shown. In FIG. 2F, gain region 210 includes three quantum well (QW) layers 250 of InGaAs. Absorber 206 includes three QW layers 252 of GaInNAs. A standing wave pattern of the laser wavelength 254 is shown in monolithic gain structure 224. A graph 256 references the position versus field intensity of wave 254.

FIG. 2G illustrates the minimum energy states of electrons residing within the conduction bands of the QW layers in FIG. 2F. Energy levels at QWs 258 correspond to the gain region QW layers 250, and energy levels at QWs 260 correspond to the absorber QW layers 252.

Figure 6:
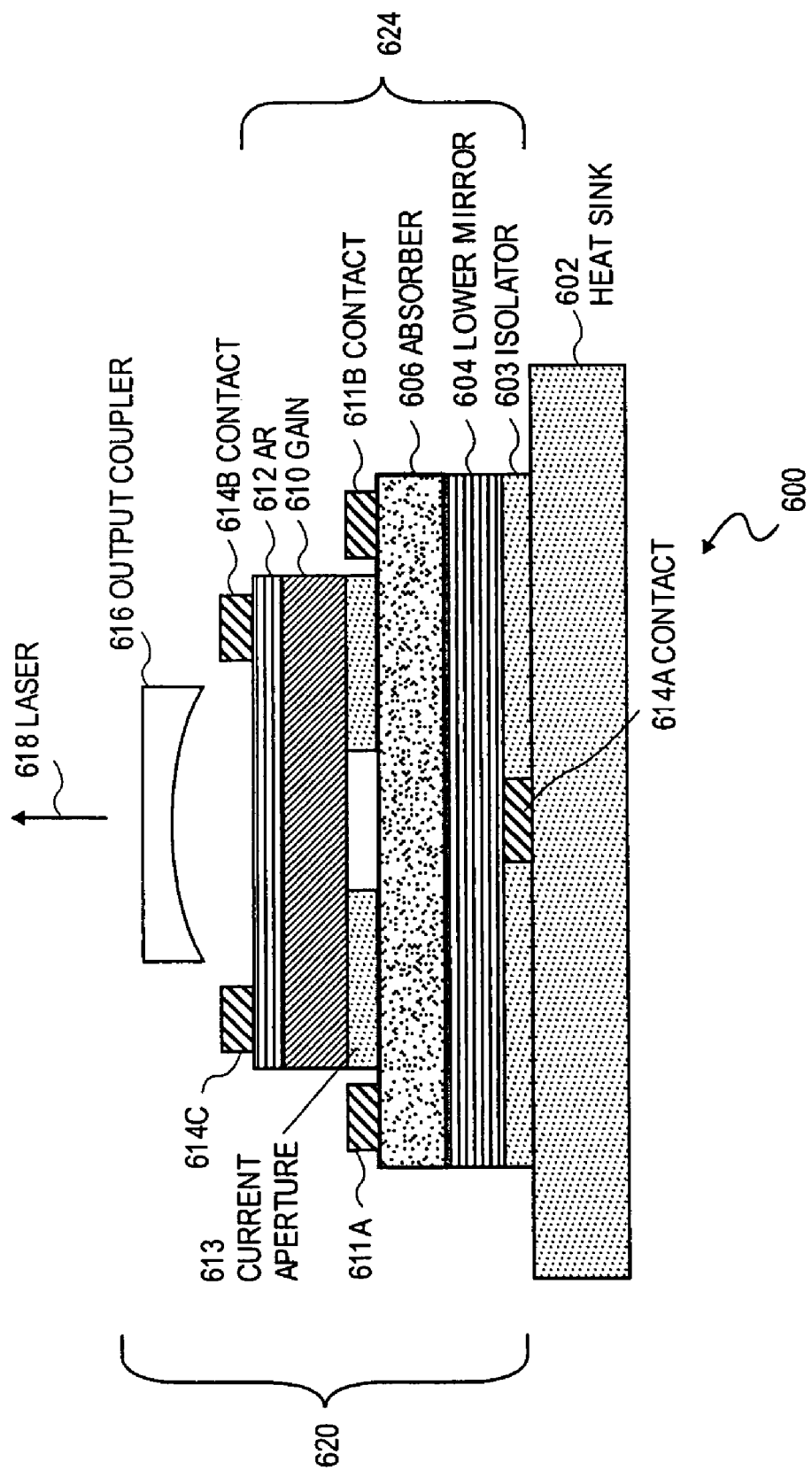
FIG. 6 is a block diagram illustrating one embodiment of a SEL with an integrated absorber in accordance with the teachings of the present invention.

In one embodiment, the saturation fluence of the absorber 206 may be adjusted by applying an electrical current to the absorber. In FIG. 6, discussed below, an embodiment of an SEL is illustrated having separate electrical contacts to allow tuning of the absorber. In one embodiment, electrically adjusting the saturation fluence of the absorber may be conducted in conjunction with other means of lowering the saturation fluence of the absorber.

In one embodiment, lower mirror 204, absorber 206, and gain region 210 are assembled in a single fabrication process to form monolithic gain structure 224. It will be understood that additional layers, such as pump mirror 208 and AR layer 212, may also be fabricated in the monolithic gain structure 224 during this process. In one embodiment, the monolithic gain structure 224 is formed in an MBE or an MOVPE reactor. In this instance, structure 224 may also be referred to as an epitaxial stack. Since the gain region and the absorber are compatible for combined epitaxial growth, they can be integrated into the same monolithic structure.

Figure 3:
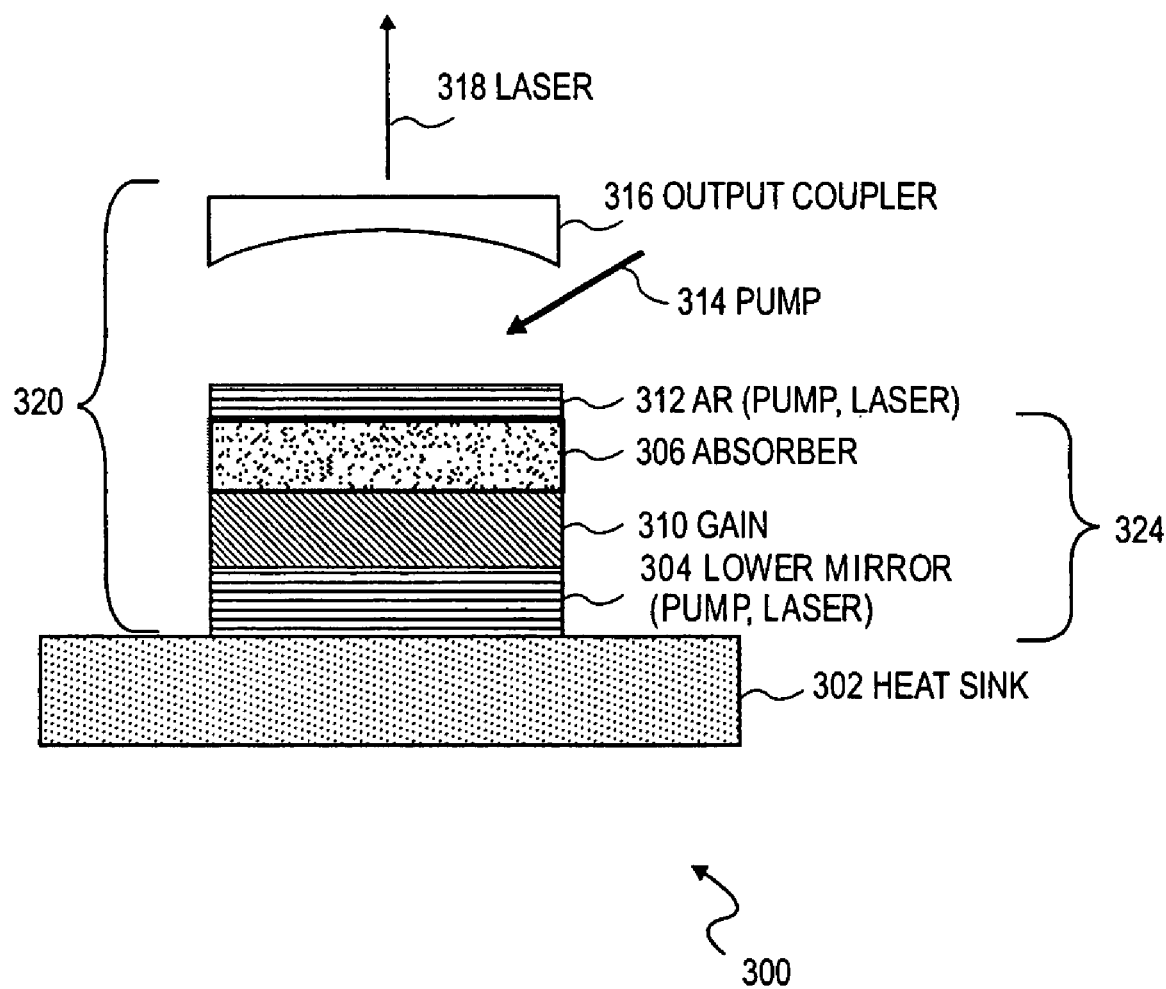
FIG. 3 is a block diagram illustrating one embodiment of a SEL with an integrated absorber in accordance with the teachings of the present invention.
Figure 4:
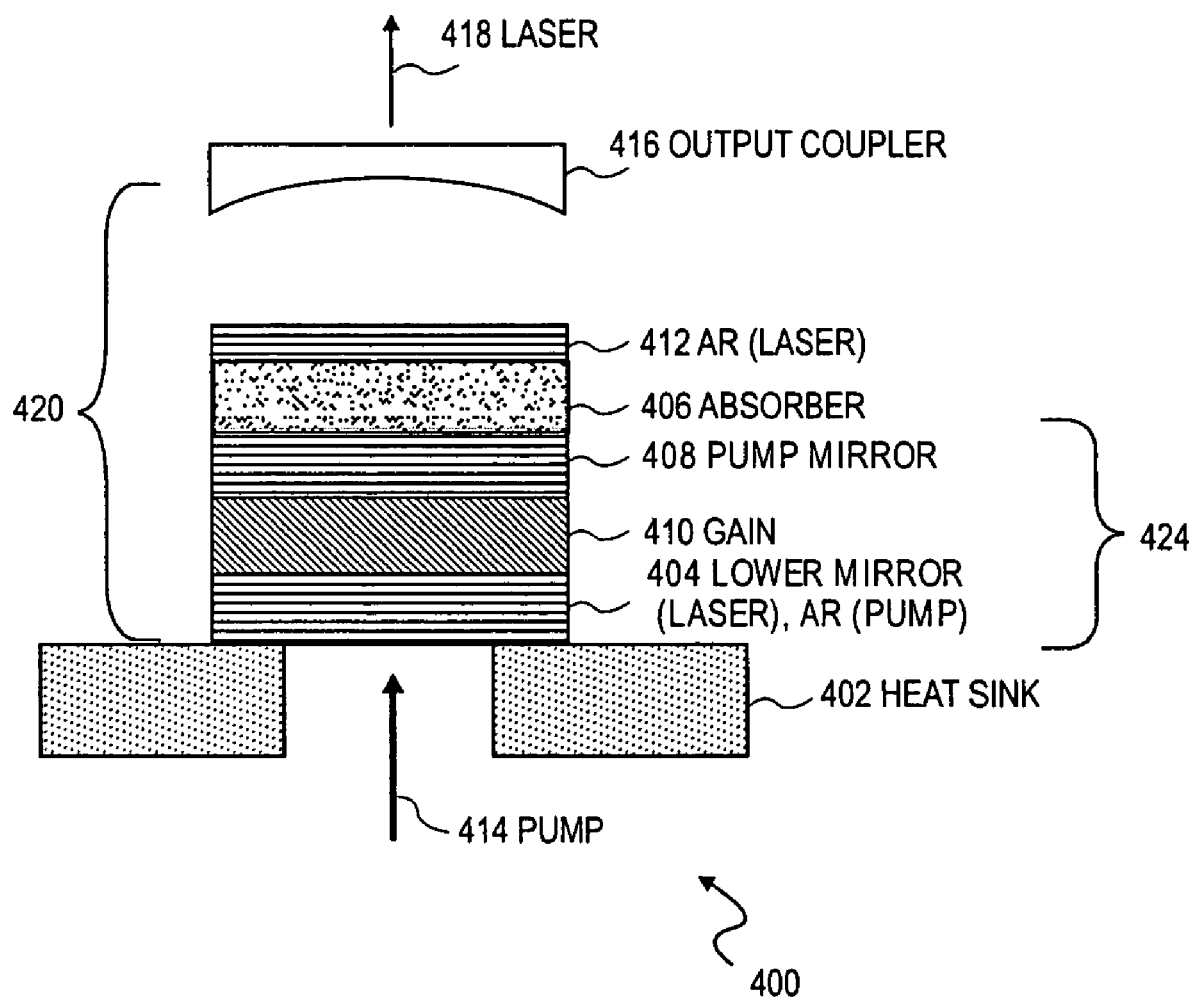
FIG. 4 is a block diagram illustrating one embodiment of a SEL with an integrated absorber in accordance with the teachings of the present invention.

For optically pumped embodiments, the substrate is completely removed including the etch-stop layers in order to expose the top layers of the structure (such embodiments shown in FIGS. 2-4). For electrically pumped embodiments, the substrate may be used as an additional intracavity spacer (such embodiments shown in FIGS. 7-9). Substrates that may be used in fabrication of the monolithic gain structure include, but are not limited to, gallium arsenide, indium phosphide, or the like. During fabrication, individual material fluxes are applied as appropriate to achieve the desired composition of the various layers.

In SEL 200, the output coupler 216 may be rigidly attached to the semiconductor surface. In another embodiment discussed below, the output coupler 216 is fabricated in the semiconductor material itself to form a microlens. In such an embodiment, the SEL provides for wafer-scale production and testing. No post-dicing alignment is needed. Further, such wafer-scale production allows fabrication of two-dimensional arrays of SELs (discussed below in conjunction with FIGS. 9A and 9B). In yet another embodiment, the necessary shaping of the beam within the laser cavity can be realized by tailoring temperature distributions to yield appropriate thermal lenses. Thermal lenses may arise due to the change of refractive index with temperature and thermal expansion of the material caused by temperature distributions induced e.g. by pump profiles. In such a case, the curvature of the output coupler may be reduced or omitted completely.

Referring again to FIG. 2A, a heat sink 202 is coupled to SEL 200. In the embodiment of FIG. 2A, heat sink 202 is coupled below the lower mirror 204 of SEL 200. In order to alleviate heating problems associated with high output power, embodiments described herein may use upside-down mounting. The monolithic gain structure is grown in reverse order, starting with an etch-stop layer. After cleaving individual pieces, the epitaxial side is bonded directly to a heat sink. The substrate may be removed using techniques well known in the art. This mounting technique ensures very small thermal impedance by strongly reducing the thickness of the semiconductor structure. The resulting one-dimensional heat flow then allows for power scaling by further increasing the mode area in proportion to the power level, while in the geometry, the maximum temperature excursion is not significantly increased due to the increased mode area.

Referring again to FIG. 2A, in one embodiment, a nonlinear crystal 222 is optically coupled to the output coupler 216. In another embodiment, crystal 222 is positioned inside of laser cavity 220. Crystal 222 may be used to change the wavelength of laser output 218 by second harmonic generation or optical parametric oscillation. Crystal 222 may include, but is not limited to, potassium tytanil phosphate (KTP), potassium tytanil niobate (KTN), potassium niobate (KNbO$_3$), lithium niobate (LiNbO$_3$), periodically-poled materials, such as periodically-poled LiNbO3, or the like.

Referring to FIG. 3, a SEL 300 in accordance with one embodiment of the present invention is shown. The embodiment of FIG. 3 shows an optically pumped gain structure with an integrated absorber where the absorber transmits the pump light to the gain region. A gain region 310 is positioned on lower mirror 304. Lower mirror 304 also serves as a pump mirror for optical pump 314. Absorber 306 is positioned on gain region 310. An AR layer 312 is positioned on absorber 306. Lower mirror 304, gain region 310, absorber 306, and AR layer 312 form a monolithic gain structure 324.

An output coupler 316 is positioned above the AR layer 312 and emits laser output 318. The output coupler 316 and the lower mirror 304 define a laser cavity 320. A heat sink 302 is coupled to SEL 300 below lower mirror 304.

FIG. 4 shows a SEL 400 in accordance with one embodiment of the present invention. The embodiment of FIG. 4 shows an optically pumped gain structure with an integrated absorber where the gain region is pumped from the backside. A gain region 410 is positioned on lower mirror 404. The lower mirror 404 is highly-reflective for the laser energy, but anti-reflective as to the optical pump energy. A pump mirror 408 is positioned on the gain region 410. An absorber 406 is positioned on the pump mirror 408. An AR layer 412 is positioned on absorber 406. Lower mirror 404, gain region 410, pump mirror 408, absorber 406, and AR layer 412 form a monolithic gain structure 424.

An output coupler 416 is positioned above AR layer 416 and emits laser output 418. The output coupler 416 and the lower mirror define a laser cavity 420. A heat sink 402 is coupled to SEL 400 below lower mirror 414. The heat sink 414 includes an aperture to allow pump light to enter the laser cavity 420 from the backside of SEL 400.

Figure 5:
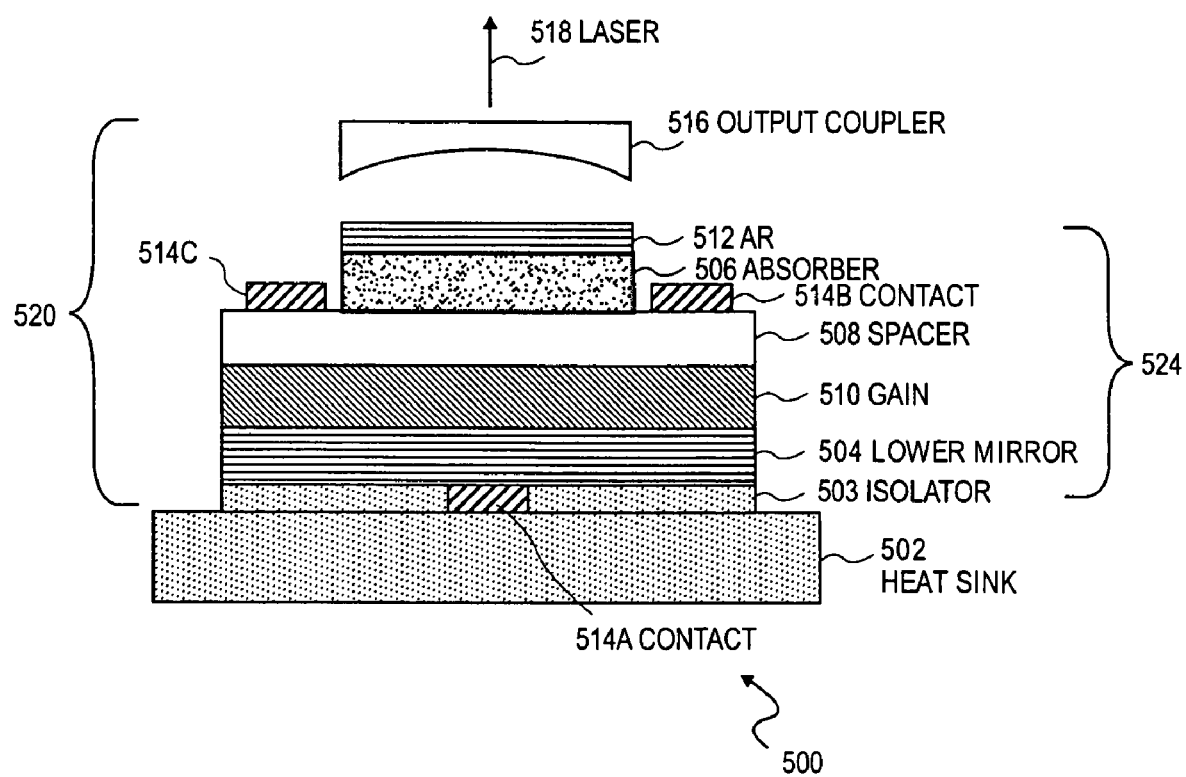
FIG. 5 is a block diagram illustrating one embodiment of a SEL with an integrated absorber in accordance with the teachings of the present invention.

FIG. 5 shows a SEL 500 in accordance with one embodiment of the present invention. The embodiment of FIG. 5 shows an electrically pumped gain structure with an integrated absorber. Lower mirror 504 is positioned on an isolator 503. Isolator 503 electrically isolates the lower mirror 504 from heat sink 502. Isolator 503 includes an opening to allow current to pass from contact 514a to contacts 514b,c in a defined opening. Gain region 510 is positioned on lower mirror 504.

A spacer 508 is positioned on gain region 510. In one embodiment, the size of spacer 508 is determined at fabrication in order provide sufficient length for the current injected between contacts 514a,b,c to spread to form a profile which favors fundamental-mode operation in the gain section. It will also be noted that the size of spacer 508 affects the length of laser cavity 520 and thus the repetition rate of the laser output 518.

An absorber 506 is positioned on spacer 508. An AR layer 512 is positioned on absorber 506. Isolator 503, lower mirror 504, gain region 510, spacer 508, absorber 506, and AR layer 512 form a monolithic gain structure 524.

An output coupler 516 is positioned above AR layer 512 and emits laser output 518. Output coupler 516 and lower mirror 504 define laser cavity 520. A heat sink 502 is coupled to SEL 500 below isolator 503. SEL 500 is electrically pumped via contact 514a coupled to lower mirror 504 and contacts 514b and 514c coupled to spacer 508.

FIG. 6 shows a SEL 600 in accordance with one embodiment of the present invention. The embodiment of FIG. 6 shows an electrically pumped gain structure with an integrated absorber and separate electrical contacts for tuning of the absorber. Lower mirror 604 is positioned on an isolator 603. Absorber 606 is positioned on lower mirror 604.

A current aperture layer 613 is positioned on the absorber 606. Contacts 611a and 611b allow for changing of the saturation fluence of the absorber using an electrical signal. The current aperture layer 613 electrically isolates the absorber 606 from the gain region 610 and includes an opening to allow current to pass from contact 614a to contacts 611a,b in a defined opening. The current aperture layer is transparent to the laser wavelength to allow light to pass between the mirrors of the cavity 620.

Gain region 610 is positioned on current aperture 613. AR layer 612 is positioned on gain region 610. Isolator 603, lower mirror 604, absorber 606, current aperture 613, gain region 610, and AR layer 612 form a monolithic gain structure 624.

An output coupler 616 is positioned above AR layer 612 and emits laser output 618. Output coupler 616 and lower mirror 604 define laser cavity 620. A heat sink 602 is coupled to SEL 600 below isolator 603. SEL 600 is electrically pumped via contact 614a coupled to lower mirror 604 and contacts 614b and 614c coupled to AR layer 612. The absorber 606 may be electrically tuned via contact 614a coupled to lower mirror 604 and contacts 611a and 611b coupled to absorber layer 606.

Figure 7:
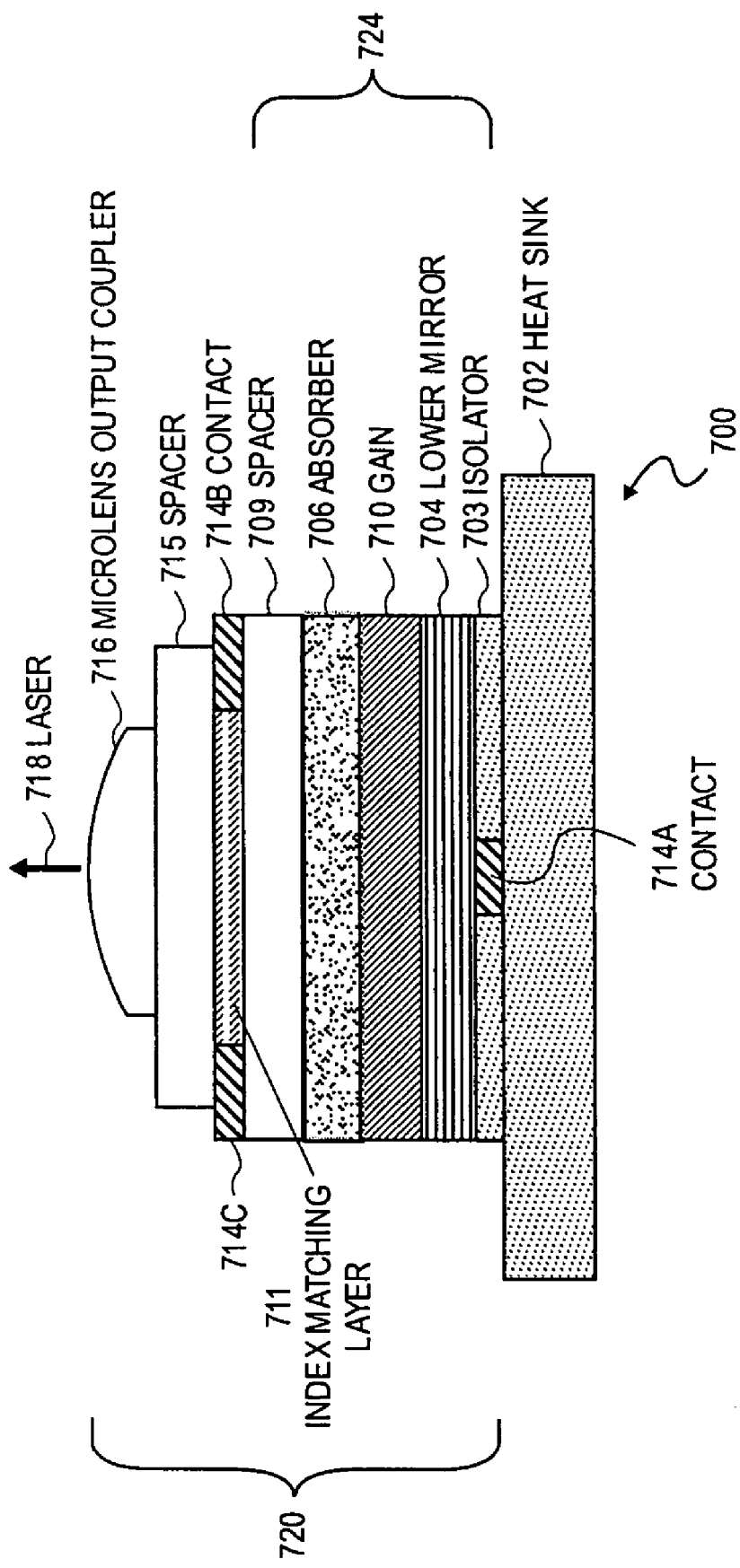
FIG. 7 is a block diagram illustrating one embodiment of a SEL with an integrated absorber in accordance with the teachings of the present invention.

FIG. 7 shows a SEL 700 in accordance with one embodiment of the present invention. The embodiment of FIG. 7 shows an electrically pumped gain structure with an integrated absorber using a dielectrically coated integrated microlens as the output coupler. Lower mirror 704 is positioned on an isolator 703. Gain region 710 is positioned on lower mirror 704. Absorber 706 is positioned on gain region 710. A spacer 709 is positioned on absorber 706. Monolithic gain structure 724 includes isolator 703, lower mirror 704, gain region 710, absorber 706, and spacer 709.

In one embodiment, the monolithic gain structure 724 is grown onto spacer 709. Spacer 709 includes a substrate such as gallium arsenide (GaAs). In reference to FIG. 7, the layers would be grown down starting with spacer 709, then absorber 706, and so on to isolator 703. After monolithic structure 724 is grown, additional layers, such as spacer 715 may be added to complete the production of SEL 700.

An index matching layer 711 may be positioned on spacer 709. Index matching layer 711 avoids additional reflections of the laser light inside the cavity. It also provides a rigid attachment of spacer 715 to contacts 714b,c and spacer 709.

A spacer 715 is positioned on index matching layer 711. The sizes of spacers 709 and 715 may be adjusted at fabrication in order to achieve a desired cavity length of laser cavity 720. In an alternative embodiment of SEL 700, spacer 715 is not attached such that microlens 716 is positioned on index matching layer 711. In another embodiment, spacer 709 is removed during fabrication such that index matching layer 711 is positioned on absorber 706.

A microlens 716 is positioned on spacer 715. Laser output 718 is emitted from microlens 716. Microlens 716 may be coated to provide adequate reflectivity at laser wavelength. Laser cavity 720 is defined by lower mirror 704 and microlens 716. A heat sink 702 is coupled to SEL 700 below isolator 703. Electrical pumping is provided to SEL 700 via contact 714a coupled to the lower mirror 704 and contacts 714b and 714c coupled to the index matching layer 711.

Figure 8:
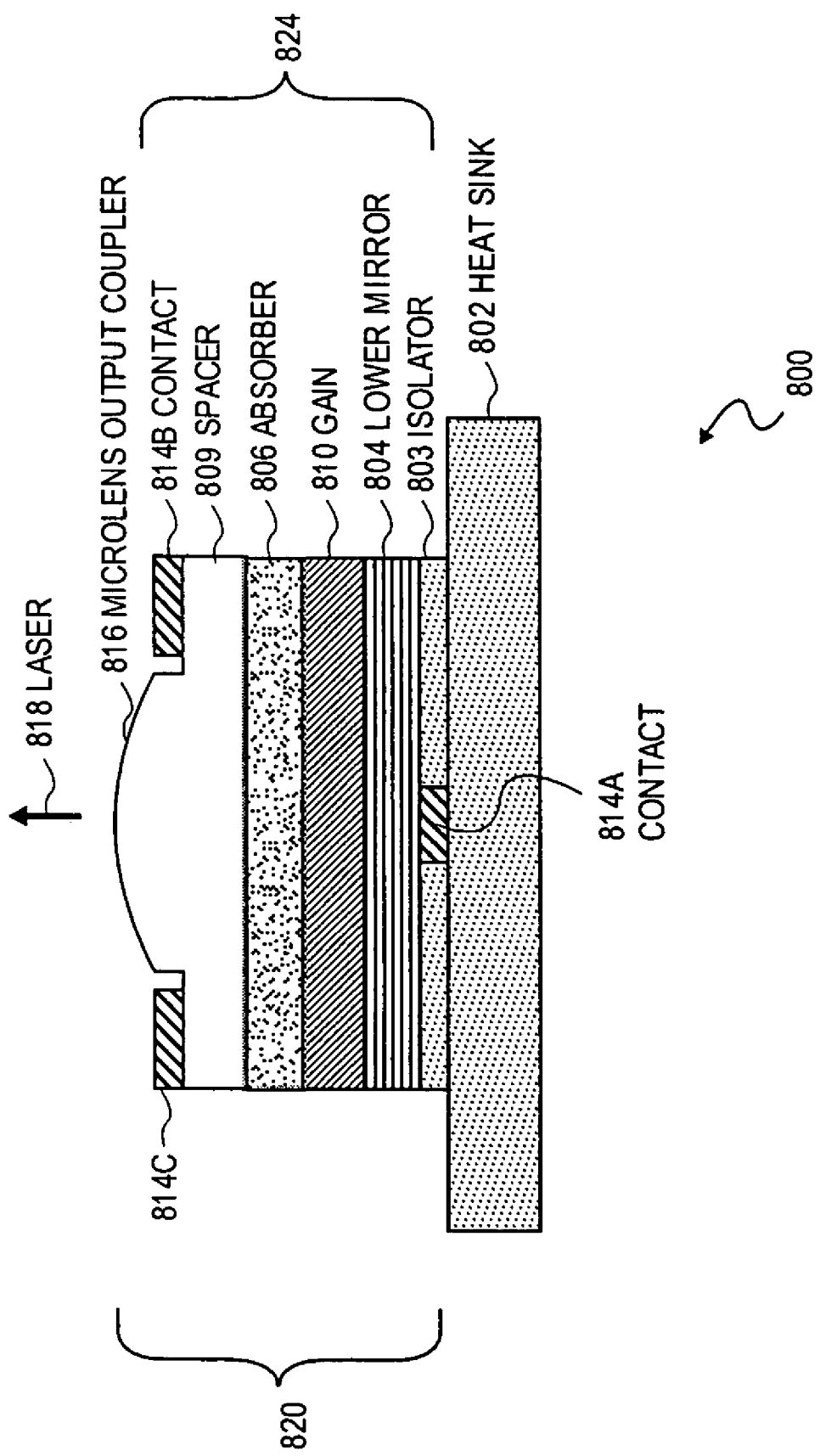
FIG. 8 is a block diagram illustrating one embodiment of a SEL with an integrated absorber in accordance with the teachings of the present invention.

FIG. 8 shows a SEL 800 in accordance with one embodiment of the present invention. The embodiment of FIG. 8 shows an electrically pumped gain structure with an integrated absorber using a dielectrically coated integrated microlens fabricated from the same substrate as the gain structure. Lower mirror 804 is positioned on an isolator 803. Gain region 810 is positioned on lower mirror 804. An absorber 806 is positioned on gain region 810.

Spacer 809, which includes microlens 816, is positioned on absorber 806. In SEL 800, microlens 816 is formed from the same piece of substrate used to grow the monolithic gain structure 824. The top shape of microlens 816 is etched using processes well known in the art. Microlens 816 may be coated to provide adequate reflectivity at laser wavelength. As described above in conjunction with FIG. 7, the size of the spacer 809 may be grown or etched to achieve the desired cavity length.

Laser cavity 820 is defined by lower mirror 804 and microlens 816. A heat sink 802 is coupled to SEL 800 below isolator 803. Electrical pumping is provided to SEL 800 via contact 814a coupled to the lower mirror 804 and contacts 814b and 814c coupled to spacer 809. In operation, passively mode-locked laser output 818 is emitted from microlens 816.

SEL 800 provides a simple linear cavity that may be electrically pumped. SEL 800 may generate a passively mode-locked laser output with a high repetition rate. In one embodiment, SEL 800 may produce a 50-100 GHz signal. SEL 800 is fully integrated resulting in a small size and has the benefits of wafer level high-volume manufacturing. In one embodiment, SEL 800 is fabricated using GaAs MBE.

Figure 9A:
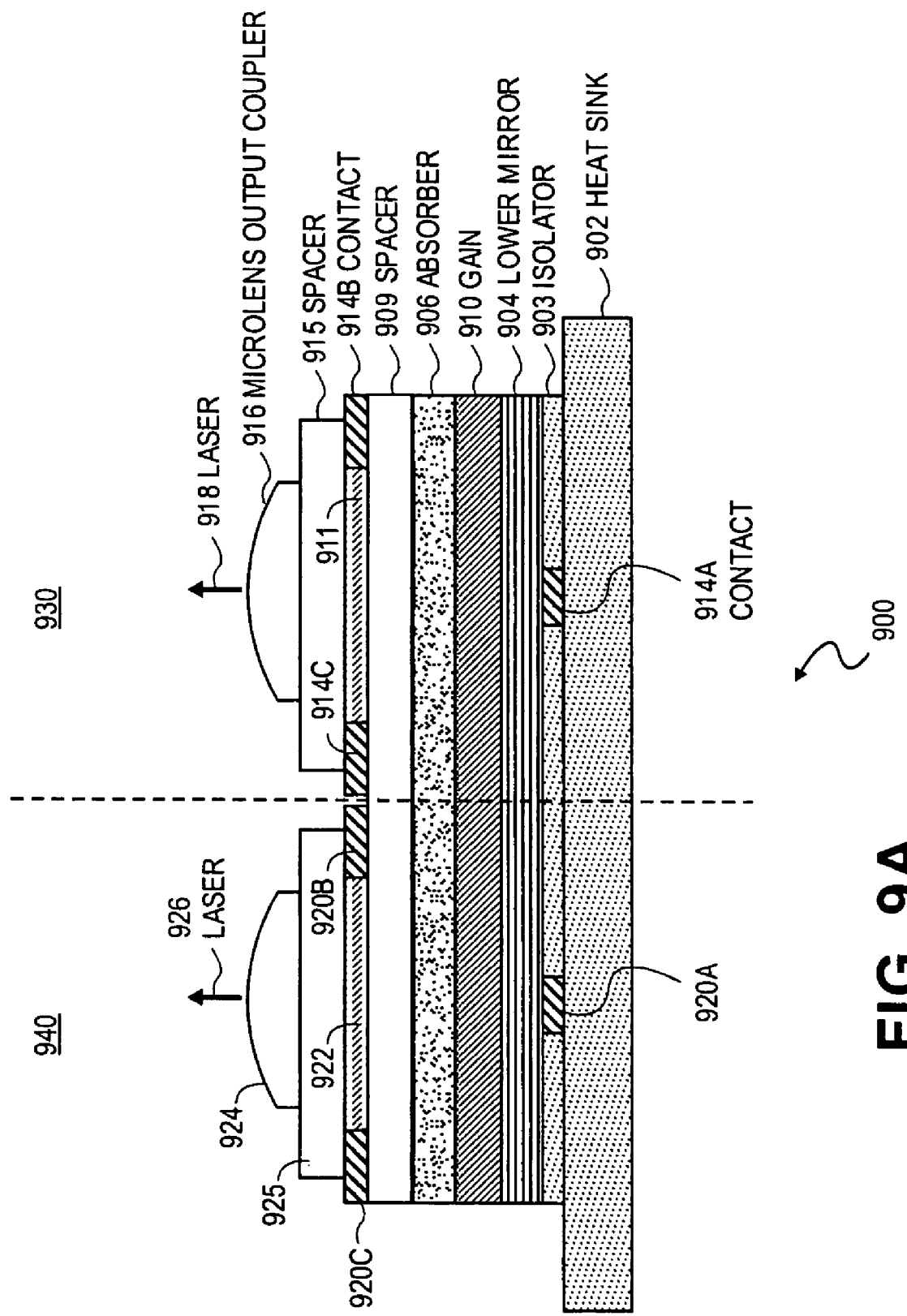
FIG. 9A is a block diagram illustrating one embodiment of an array of SELs with integrated absorbers in accordance with the teachings of the present invention.

FIG. 9A illustrates one embodiment of an array 900 of electrically pumped SELs having integrated absorbers. Array 900 includes a SEL 930 and a SEL 940. A heat sink 902 may be coupled to the bottom of SELs 930 and 940. In other embodiments, array 900 may include additional SELs.

SEL 930 and SEL 940 share the following layers. Lower mirror 904 is positioned on an isolator 903. Gain region 910 is positioned on lower mirror 904. Absorber 906 is positioned on gain region 910. A spacer 909 is positioned on absorber 906. In one embodiment, SEL 930 and SEL 940 may be electrically isolated from each other. In one instance, such isolation may be achieved by etching between SEL 930 and SEL 940.

SEL 930 includes the following layers. An index matching layer 911 is positioned on spacer 909. A spacer 915 is positioned on index matching layer 911. A microlens 916 is positioned on spacer 915. Laser output 918 is emitted from microlens 916. Electrical pumping is provided to SEL 930 via contact 914a coupled to the lower mirror 904 and contacts 914b and 914c coupled to the index matching layer 911.

SEL 940 includes the following layers. An index matching layer 922 is positioned on spacer 909. A spacer 925 is positioned on index matching layer 922. A microlens 924 is positioned on spacer 925. Laser output 926 is emitted from microlens 924. Electrical pumping is provided to SEL 940 via contact 920a coupled to the lower mirror 904 and contacts 920b and 920c coupled to the index matching layer 922.

In one embodiment, SEL 930 and SEL 940 are individually addressable. A controller (not shown) coupled to array 900 may provide control of each SEL. In one embodiment, electrical pumping is provided only to the addressed SEL. In another embodiment, spacer 915 and 925 may be of different sizes. In this instance, the cavity length of SEL 930 is different than the cavity length of SEL 940 so that SELs 930 and 940 produce output with different repetition rates.

Figure 9B:
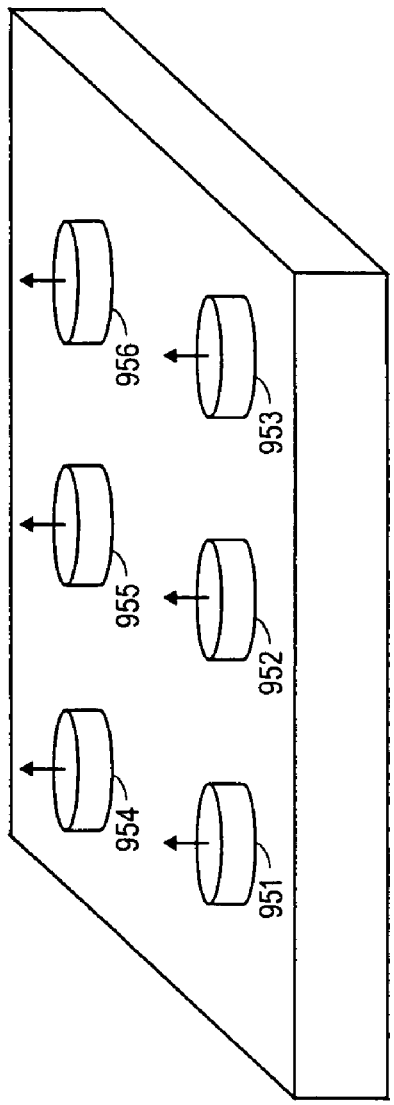
FIG. 9B is a perspective view diagram illustrating one embodiment of an array of SELs with integrated absorbers in accordance with the teachings of the present invention.

FIG. 9B shows an embodiment of a two-dimensional array 950. The array 950 includes SELs 951-956, where at least one SEL has an integrated absorber as described herein. In one embodiment, each SEL 951-956 is individually addressable. In another embodiment, each SEL 951-956 is configured to provide a passively mode-locked output at a unique repetition rate. In yet another embodiment, each SEL 951-956 is configured to provide a passively mode-locked output at a unique power level.

Figure 10:
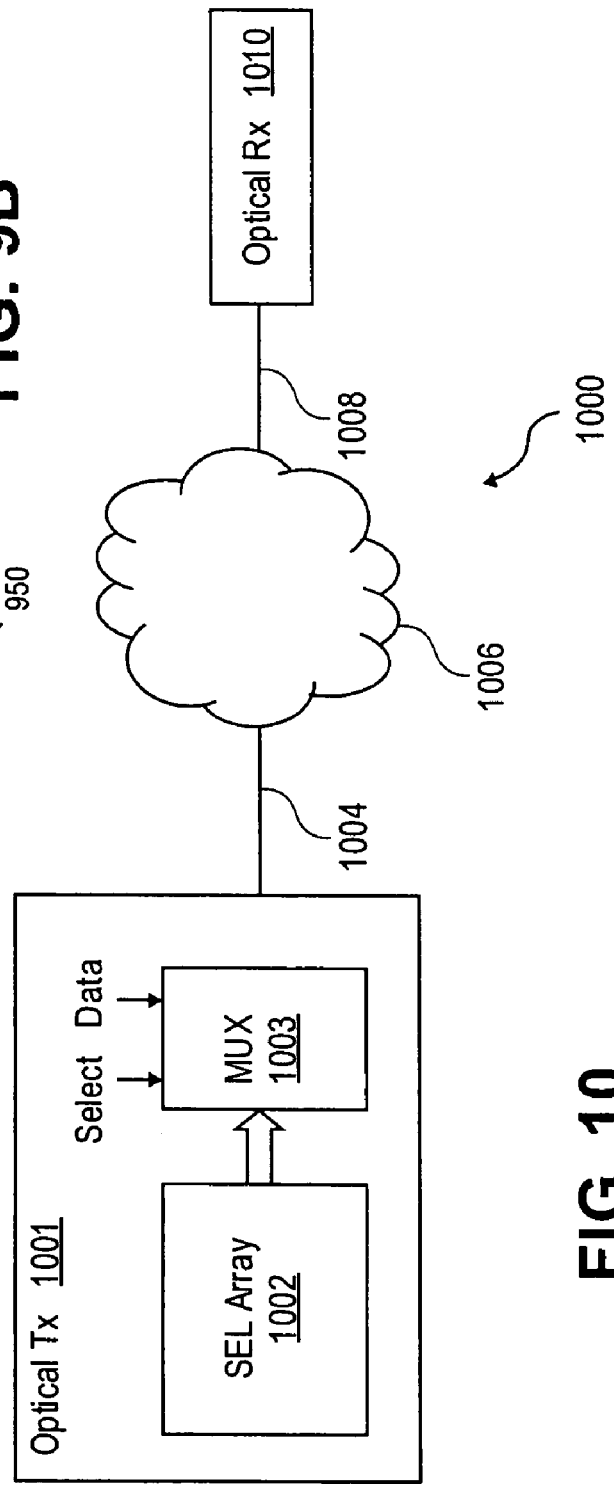
FIG. 10 is a block diagram illustrating one embodiment of a communication system in accordance with the teachings of the present invention.

FIG. 10 shows an embodiment of a communication system 1000. Optical transmitter 1001 includes a SEL array 1002 optically coupled to a multiplexer 1003. SEL array 1002 includes at least one SEL having an integrated absorber as described herein. Multiplexer 1003 includes a select input and a data input. The select input is used to select a SEL of SEL array 1002. The data input is used to receive data for modulation of the output of optical transmitter 1001. Tunable transmitter 1001 outputs an optical signal to an optical channel 1004 optically coupled to optical transmitter 1001. In one embodiment, the optical signal includes an optical time division multiplexing (OTDM) signal. The optical channel 1004 is optically coupled to a network 1006. In one embodiment, network 1006 is a photonic packet-switched network. Network 1006 is optically coupled to an optical channel 1008. An optical receiver 1010 is optically coupled to optical channel 1008 to receive the optical signal. In one embodiment, the optical channels 1004 and 1008 include optical fiber.

Figure 11:
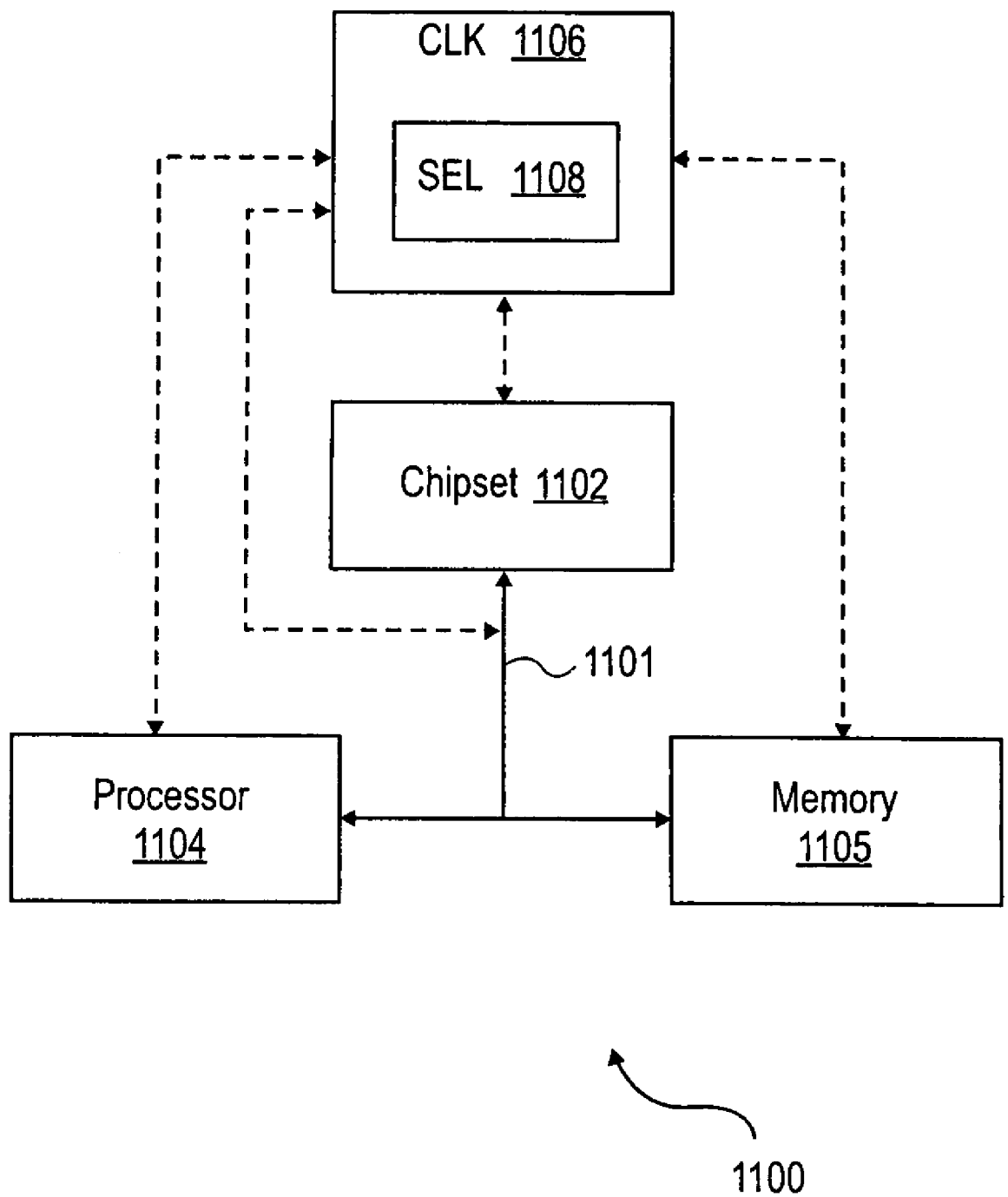
FIG. 11 is a block diagram illustrating one embodiment of a computer system in accordance with the teachings of the present invention.

FIG. 11 shows one embodiment of a computer system 1100. Computer system 1100 includes a chipset 1102 coupled to a processor 1104 and a memory device 1105 via bus 1101. Computer system 1100 also includes a system clock 1106 to provide clocking signals to chipset 1102, processor 1104, memory 1105, and bus 1101. In another embodiment, system clock 1106 only provides clocking signals to processor 1104. In one embodiment, system clock 1106 outputs clocking signals as optical signals. In other embodiments, clocking signals of system clock 1106 are outputted as electrical signals.

The system clock 1106 includes a SEL 1108 having an integrated absorber, as described herein, to serve as an oscillator for system clock 1106. In one embodiment, the system clock 1106 may operate at 10 GHz or faster. In another embodiment, system clock 1106 may include one or more frequency dividers or one or more frequency multipliers to provide clocking signals to components coupled to system clock 1106.

Figure 12:
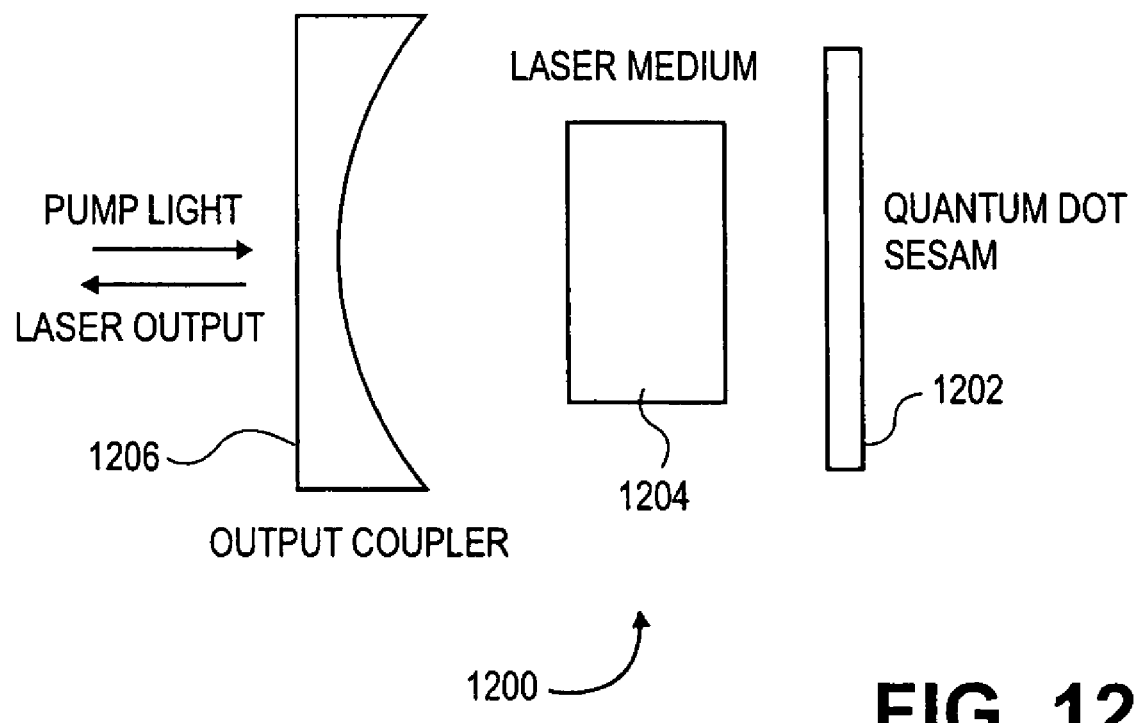
FIG. 12 is a block diagram illustrating one embodiment of a solid-state laser with a quantum dot saturable absorber mirror in accordance with the teachings of the present invention.

FIG. 12 illustrates a solid-state laser 1200 having a quantum dot semiconductor saturable absorber mirror (SESAM) 1202 in accordance with one embodiment of the present invention. Generally, a SESAM modulates the gain in the laser cavity as a function of intensity. This passively mode-locks the laser. Absorber mirror 1202 includes one or more layers of quantum dots, as described above, that give the absorber mirror 1202 a low saturation fluence.

Solid-state laser 1200 includes a laser medium 1204 and an output coupler 1206. Laser medium 1204 includes Er:Yb (erbium doped ytterbium), Er:glass (erbium doped glass), Nd:Vanadate (neodymium doped vanadate), Nd:YAG (neodymium doped yttrium aluminum garnet ($Y_3Al_5O_{12}$)), Nd:glass (neodymium doped glass), or the like. In the embodiment of FIG. 12, solid-state laser 1200 is pumped by a diode pump (not shown).

Using a quantum dot absorber 1202 with a low saturation fluence in a solid-state laser facilitates cavity design as the requirements on mode size ratio between gain and absorber materials are significantly relaxed. In addition, absorber heating can be much reduced by increasing the mode size on the absorber, especially at high repetition rates and for high average powers.

Figure 13:
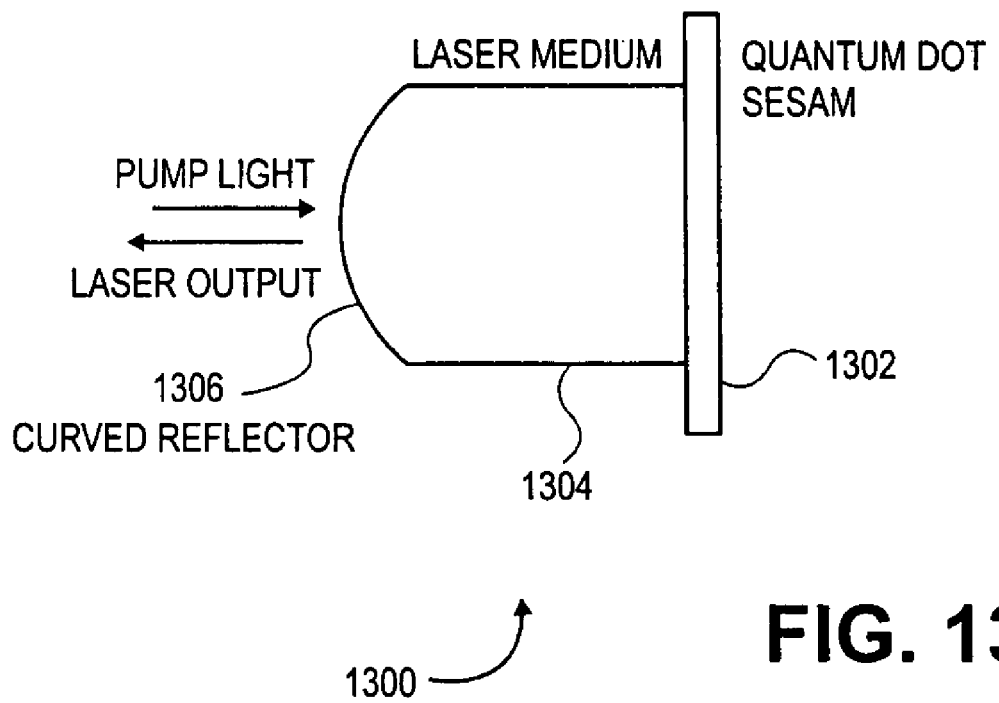
FIG. 13 is a block diagram illustrating one embodiment of a solid-state laser with a quantum dot saturable absorber mirror in accordance with the teachings of the present invention.

FIG. 13 illustrates a solid-state laser 1300 having a quantum dot semiconductor saturable absorber mirror 1302 integrated into the solid-state laser medium 1304. Laser medium 1304 includes similar media as described above in conjunction with laser medium 1204. Laser medium 1304 includes a curved reflector 1306. Quantum dot semiconductor saturable absorber mirror 1302 includes a high reflector, including a semiconductor Bragg stack, and one or more quantum dot absorber layers, separated by transparent spacer layers. Thickness of the spacer layers is chosen to adjust optical thickness of the total structure for optical standing wave effects (resonance or anti-resonance).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A surface emitting laser (SEL), comprising:
a saturable absorber integrated with a gain region in a monolithic gain structure in a laser cavity of an SEL, the saturable absorber and the gain region being assembled in a single fabrication process to form the monolithic gain structure, the monolithic gain structure having at least one contact coupled to a pump to provide energy to the SEL, in response to which the saturable absorber and gain region operate with laser mode spot sizes in a Rayleigh range of a Gaussian laser mode of the SEL, the gain region and the saturable absorber being within the Rayleigh range of the Gaussian laser mode;
the saturable absorber having a reduced saturation fluence relative to a saturation fluence of the gain region,
wherein the SEL emits passively mode-locked laser output,
wherein the saturable absorber comprises regions with quantum dots and regions without quantum dots, the regions with quantum dots being arranged in plural layers of quantum dots, and the saturation fluence of the saturable absorber relative to the saturation fluence of the gain region is reduced, and
wherein the plural layers of quantum dots includes a first plurality of layers including quantum dots and a second plurality of layers including quantum dots, each of the first and second plurality of layers being positioned on separate respective peaks of a standing wave pattern, the region of the saturable absorber between and adjoining the first and second plurality of layers being a region without quantum dots, and the saturation fluence of the saturable absorber adjusts relative to the saturation fluence of the gain region.

2. The SEL of claim 1, wherein a size of the quantum dots comprising the absorber range in diameter at the base of the quantum dot from 10 to 50 nanometers, and range in height of the quantum dot from 2-10 nanometers.

3. The SEL of claim 2, wherein a density of the quantum dots comprising the absorber reduces the saturation fluence of the absorber relative to the saturation fluence of the gain region, wherein the density is based on the size of the quantum dots.

4. The SEL of claim 2, wherein a distribution of the quantum dot sizes produces a desired spectral width of absorption in the absorber.

5. The SEL of claim 1, wherein the gain region in the monolithic gain structure is electrically pumped via the at least one contact coupled to the pump for providing energy to the SEL.

6. The SEL of claim 5, wherein the monolithic gain structure includes a lower mirror at a lower end of the laser cavity, wherein the at least one contact is coupled to the pump for providing energy to the SEL via the lower mirror.

7. The SEL of claim 6, wherein the at least one contact coupled to the pump for providing energy to the SEL includes a contact that is coupled to the pump for providing energy to the SEL via one of a spacer, anti-reflective, and index-matching layers in the SEL.

8. An apparatus, comprising:
the surface emitting laser (SEL) of claim 1, wherein the saturable absorber is arranged as a mirror;
an output coupler, the saturable mirror and the output coupler defining a laser cavity; and
a laser medium positioned within the laser cavity.

9. The apparatus of claim 8 wherein the quantum dot semiconductor saturable absorber mirror is integrated with the laser medium.

10. The apparatus of claim 9 wherein the output coupler is a curved reflector integrated with the laser medium.

* * * * *